(12) United States Patent  
Son

(10) Patent No.: US 11,289,635 B2
(45) Date of Patent: Mar. 29, 2022

(54) LIGHT EMITTING DIODE DISPLAY APPARATUS AND MULTI SCREEN DISPLAY APPARATUS USING THE SAME

(71) Applicant: LG Display Co., Ltd., Seoul (KR)

(72) Inventor: HyeonHo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 13 days.

(21) Appl. No.: 16/728,413

(22) Filed: Dec. 27, 2019

(65) Prior Publication Data

US 2020/0212279 A1  Jul. 2, 2020

(30) Foreign Application Priority Data

Dec. 31, 2018 (KR) .................. 10-2018-0173389

(51) Int. Cl.
| | |
|---|---|
| *H01L 33/38* | (2010.01) |
| *H01L 33/62* | (2010.01) |
| *H01L 25/075* | (2006.01) |
| *H01L 33/52* | (2010.01) |

(52) U.S. Cl.
CPC .......... *H01L 33/62* (2013.01); *H01L 25/0753* (2013.01); *H01L 33/52* (2013.01)

(58) Field of Classification Search
CPC combination set(s) only.
See application file for complete search history.

(56) References Cited

U.S. PATENT DOCUMENTS

| | | | |
|---|---|---|---|
| 8,760,409 B2 * | 6/2014 | Kinoshita | G06F 1/3262 345/173 |
| 9,129,923 B1 | 9/2015 | Han et al. | |
| 2004/0222746 A1 | 11/2004 | Winters | |

(Continued)

FOREIGN PATENT DOCUMENTS

| | | |
|---|---|---|
| CN | 104700774 A | 6/2015 |
| CN | 108206234 A | 6/2018 |

(Continued)

OTHER PUBLICATIONS

Extended European Search Report dated May 7, 2020 issued in corresponding European Patent Application No. 19216790.6.

(Continued)

*Primary Examiner* — Ali Naraghi
(74) *Attorney, Agent, or Firm* — Morgan, Lewis & Bockius LLP

(57) ABSTRACT

The light emitting diode display apparatus comprises a pixel disposed on a substrate and configured to display an image. The pixel includes a first light emitting portion configured to connect with a first gate line disposed in a first direction, a data line disposed in a second direction which is perpendicular to the first direction, and a first driving power line which is parallel to the data line, a second light emitting portion configured to connect a second gate line which is parallel to the first gate line, the data line, and the first driving power line, a common connection pattern configured to connect with the first light emitting portion and the second light emitting portion in common, and a third light emitting portion configured to connect between the second driving power line and the common connection pattern. Some of the common connection pattern is configured to overlap with the second driving power line.

20 Claims, 9 Drawing Sheets

(56) References Cited

U.S. PATENT DOCUMENTS

| | | |
|---|---|---|
| 2014/0346971 A1 | 11/2014 | Shida et al. |
| 2015/0084054 A1* | 3/2015 | Fan .......................... G02F 1/00 257/72 |
| 2015/0161943 A1 | 6/2015 | Shim et al. |
| 2017/0053591 A1 | 2/2017 | Seo et al. |
| 2017/0092193 A1 | 3/2017 | Na et al. |
| 2017/0154944 A1 | 6/2017 | Kim et al. |
| 2018/0159088 A1 | 6/2018 | Lai et al. |
| 2018/0174519 A1* | 6/2018 | Kim ........................ H01L 27/156 |
| 2018/0175268 A1* | 6/2018 | Moon ..................... H01L 27/15 |
| 2018/0188579 A1* | 7/2018 | Jeong ................. G02F 1/13454 |
| 2018/0294311 A1* | 10/2018 | Hsiang ................. G09G 3/3208 |
| 2019/0157512 A1* | 5/2019 | Jung ........................ H01L 33/44 |

FOREIGN PATENT DOCUMENTS

| | | |
|---|---|---|
| CN | 108267903 A | 7/2018 |
| EP | 3336831 A2 | 6/2018 |
| KR | 10-2017-0037729 A | 4/2017 |
| KR | 10-2017-0062603 A | 6/2017 |
| KR | 10-1749752 B1 | 6/2017 |
| KR | 10-2017-0081078 A | 7/2017 |
| KR | 10-2017-0122008 A | 11/2017 |
| TW | 201822589 A | 6/2018 |

OTHER PUBLICATIONS

Chinese Office Action dated Jul. 20, 2021, issued in corresponding Chinese Patent Application No. 201911293086.0.

Guo Rui Qian Nguyen, "Semiconductor Light Sources (LED, OLED) and Lighting Design Series: Light Source Principle and Design, 3rd Edition," 5.6.1 OLED Display Technique, GUO Ruiqian Fudan University Press, Dec. 31, 2007, pp. 412-413.

* cited by examiner

LIGHT EMITTING DIODE DISPLAY APPARATUS AND MULTI SCREEN DISPLAY APPARATUS USING THE SAME

CROSS-REFERENCE TO RELATED APPLICATIONS

This application claims the benefit of Korean Patent Application No. 10-2018-0173389 filed in Korea on Dec. 31, 2018, the entirety of which is hereby incorporated by reference.

BACKGROUND

Technical Field

The present disclosure relates to a light emitting diode display apparatus, and a multi screen display apparatus using the same.

Discussion of the Related Art

A display apparatus is widely used as a display screen for a notebook computer, a tablet computer, a smart phone, a portable display device, and a portable information device, as well as for a display screen for a television or a monitor.

A liquid crystal display apparatus and an organic light emitting display apparatus may display an image by the use of a thin film transistor functioning as a switching diode device. The liquid crystal display apparatus is not a self light emission type. Thus, in case of the liquid crystal display apparatus, an image is displayed by the use of light emitted from a backlight unit disposed below a liquid crystal display panel. This liquid crystal display apparatus includes the backlight unit therein, whereby it may have limitations on design, and luminance and response speed may be deteriorated.

The organic light emitting display apparatus includes an organic material therein, and may therefore be vulnerable to moisture. This may lead to decreased reliability and a shortened lifespan.

Recently, a light emitting diode display apparatus using a micro light emitting device has been developed and researched. This light emitting diode display apparatus may have advantages of great picture quality and high reliability. Thus, the light emitting diode display apparatus has attracted much attention as a next generation display apparatus.

However, in a process of transferring a micro light emitting diode device to a thin film transistor array substrate, a related art light emitting diode display apparatus may have problems related to decreased reliability due to a defective pixel caused by a defect in the micro light emitting diode device.

SUMMARY

Accordingly, the present disclosure is directed to a light emitting diode display apparatus and multi screen display apparatus using the same that substantially obviates one or more of the problems due to limitations and disadvantages of the related art.

An object of the present disclosure is to provide a light emitting diode display apparatus capable of repairing a defective pixel, and a multi screen display apparatus using the light emitting diode display apparatus.

Another object of the present disclosure is to provide a light emitting diode display apparatus capable of reducing power consumption, and a multi screen display apparatus using the light emitting diode display apparatus.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a light emitting diode display apparatus includes a pixel disposed on a substrate and configured to display an image, wherein the pixel includes a first light emitting portion configured to connect to a first gate line disposed in a first direction, a data line disposed in a second direction which is perpendicular to the first direction, and a first driving power line which is parallel to the data line, a second light emitting portion configured to connect to the data line, the first driving power line, and a second gate line which is parallel to the first gate line, a common connection pattern configured to connect the first light emitting portion and the second light emitting portion in common, and a third light emitting portion configured to connect between a second driving power line and the common connection pattern, wherein at least a portion of the common connection pattern is configured to overlap with the second driving power line in plan view.

In another aspect, a light emitting diode display apparatus includes a pixel disposed on a substrate and configured to display an image, wherein the pixel includes a pixel circuit connected to a data line, first and second gate lines which are perpendicular to the data line, and a first driving power line which is parallel to the data line, first and second light emitting devices configured to connect to the pixel circuit, a common connection pattern configured to connect the first light emitting device and the second light emitting device in common, and a third light emitting device connected between a second driving power line and the common connection pattern, wherein at least one of the first and second light emitting devices is configured to connect to the second driving power line via the common connection pattern.

In another aspect, a display apparatus includes a pixel including a first light-emitting device, a second light-emitting device, a third light-emitting device; a first pixel circuit connected to a first power line and configured to drive the first light-emitting device; a second pixel circuit connected to the first power line and configured to drive the second light-emitting device; and a connection pattern configured to connect the first light-emitting device and the second light-emitting device to the third light-emitting device, wherein the third light-emitting device is connected between the connection pattern and a second power line that is parallel to the first power line, and wherein a portion of the connection pattern overlaps with the second power line.

According to one or more embodiments of the present disclosure, the light emitting diode display apparatus may facilitate repair of the defective pixel, to thereby improve reliability and yield.

According to one or more embodiments of the present disclosure, the light emitting diode display apparatus may facilitate the reduction of power consumption.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE DISCLOSURE

Figure 1:
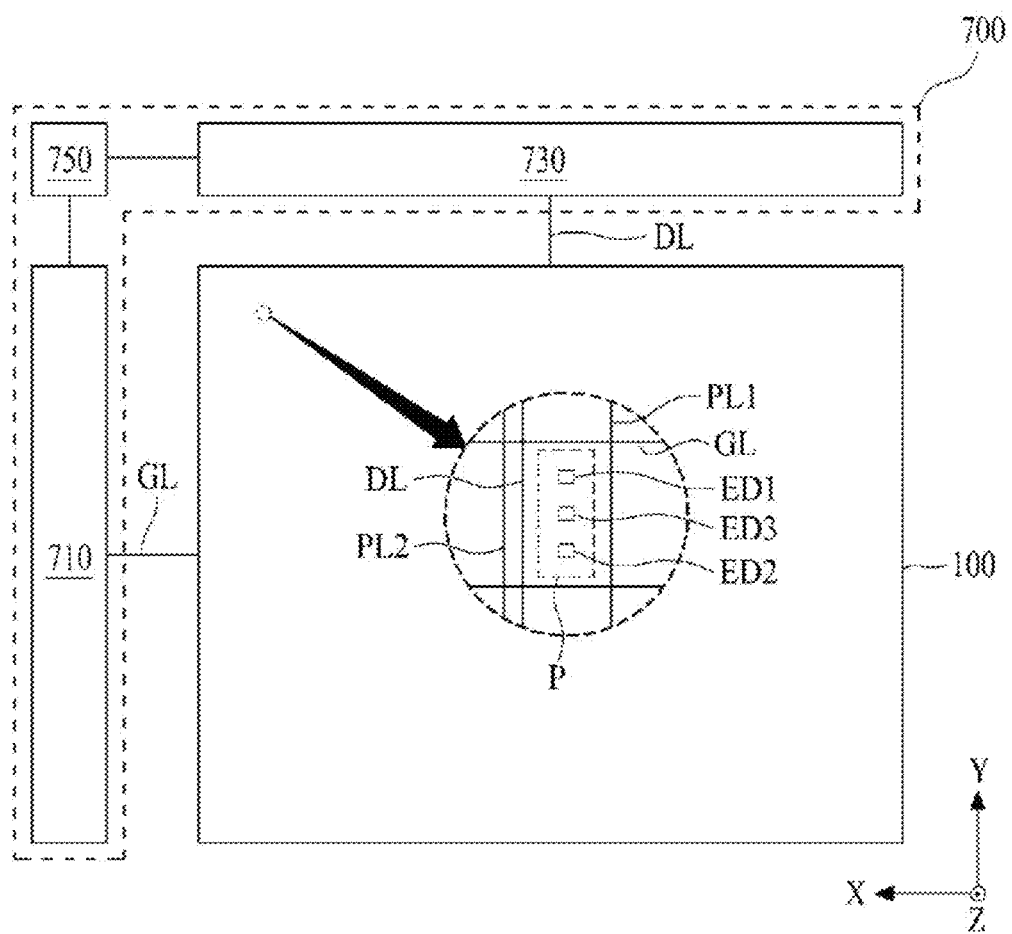
FIG. 1 illustrates a light emitting diode display apparatus according to one embodiment of the present disclosure.

Reference will now be made in detail to embodiments of the present disclosure, examples of which are illustrated in the accompanying drawings.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when the position relationship is described as "upon~," "above~," "below~," and "next to~," one or more portions may be arranged between two other portions unless "just" or "direct" is used.

In describing a time relationship, for example, when the temporal order is described as "after~," "subsequent~," "next~," and "before~," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a light emitting diode display apparatus, and a multi screen display apparatus using the same according to embodiments of the present disclosure will be described in detail with reference to the accompanying drawings. In the drawings, the same or similar elements are denoted by the same reference numerals even though they are depicted in different drawings. And, a scale of elements shown in the appended drawings may be different from a real scale, for convenience of explanation, whereby it is not limited to the scale shown in the drawings.

FIG. 1 illustrates a light emitting diode display apparatus according to one embodiment of the present disclosure.

With reference to FIG. 1, the light emitting diode display apparatus according to one embodiment of the present disclosure may include a substrate 100 and a panel driving circuit 700.

The substrate 100 corresponds to a thin film transistor array substrate, which may be formed of a glass material or a plastic material. The substrate 100 according to one embodiment of the present disclosure may include a plurality of gate lines (GL), a plurality of data lines (DL), a plurality of first driving power lines (PL1), a plurality of second driving power lines (PL2), and a plurality of pixels (P).

Each of the plurality of gate lines (GL) extends in a first direction (X), and the plurality of gate lines (GL) may be disposed at fixed intervals along a second direction (Y) on the substrate 100, wherein the second direction (Y) is perpendicular to the first direction (X). In this case, the first direction (X) may be defined in a direction parallel to a long-side direction of the substrate 100, and the second direction (Y) may be defined in a direction parallel to a short-side direction of the substrate 100. However, it may be possible to define the first direction (X) and the second direction (Y) in directions opposite to the above cases.

The plurality of data lines (DL) may be prepared on the substrate 100 while being perpendicular to the plurality of gate lines (GL). Each of the plurality of data lines (DL)

extends in the second direction (Y), and the plurality of data lines (DL) may be disposed at fixed intervals along the first direction (X).

The plurality of driving power lines (PL) are prepared on the substrate 100 while being parallel to the data lines (DL). The plurality of driving power lines (PL) may be manufactured together with the plurality of data lines (DL). Each of the plurality of driving power lines (PL) supplies first pixel driving power, which is provided from the panel driving circuit, to the adjacent pixel (P).

The plurality of second driving power lines (PL2) are prepared on the substrate 100 while being parallel to the data lines (DL). The plurality of second driving power lines (PL2) may be manufactured together with the plurality of data lines (DL). Each of the plurality of second driving power lines (PL2) supplies second pixel driving power, which is different from the first pixel driving power and is provided from the panel driving circuit, to the adjacent pixel (P). For example, the second pixel driving power may be a cathode power source or a ground voltage.

Each of the plurality of pixels (P) may be prepared in a pixel area defined by the gate line (GL) and the data line (DL). Each of the plurality of pixels (P) may be defined as a minimum unit for emitting light. The adjacent three pixels (P) may constitute one unit pixel for displaying a color. For example, one unit pixel may include a red pixel, a green pixel, and a blue pixel adjacently disposed, and may further include a white pixel for improving a luminance.

At least three pixels (P) constituting one unit pixel according to one embodiment of the present disclosure may share one of the first driving power line (PL1). In this case, the first driving power line (PL1) is prepared by each unit pixel, whereby it is possible to reduce the number of first driving power lines (PL1) prepared on the substrate 100.

The panel driving circuit 700 is connected with a pad portion prepared on the substrate 100, and the panel driving circuit 700 supplies a video signal corresponding to video data supplied from a display driving system to the plurality of pixels (P).

The panel driving circuit 700 according to one embodiment of the present disclosure may include a gate driving circuit 710, a data driving circuit 730, and a timing control circuit 750. The gate driving circuit 700 is connected with the plurality of gate lines (GL) disposed on the substrate 100. The gate driving circuit 710 generates a gate signal in accordance with an order that is preset based on a gate control signal supplied from the timing control circuit 750, and supplies the generated gate signal to the corresponding gate line (GL).

The data driving circuit 730 is connected with the plurality of data lines (DL) disposed on the substrate 100. The data driving circuit 730 receives a data control signal and pixel data for each pixel from the timing control circuit 750, and also receives a plurality of reference gamma voltages from a power source circuit. The data driving circuit 730 converts the pixel data for each pixel into a data signal for each pixel by the use of data control signal and the plurality of reference gamma voltages, and supplies the data signal for each pixel to the corresponding data line (DL).

The timing control circuit 750 receives a timing synchronization signal and video data from a display driving system. The timing control circuit 750 generates pixel data by aligning the video data to be appropriate for a pixel arrangement structure of the substrate 100 on the basis of the timing synchronization signal, and provides the generated pixel data to the data driving circuit 730. Also, the timing control circuit 750 generates the data control signal and the gate control signal on the basis of the timing synchronization signal, and controls a driving timing of each of the data driving circuit 730 and the gate driving circuit 710 by the use of data control signal and gate control signal.

Figure 2:
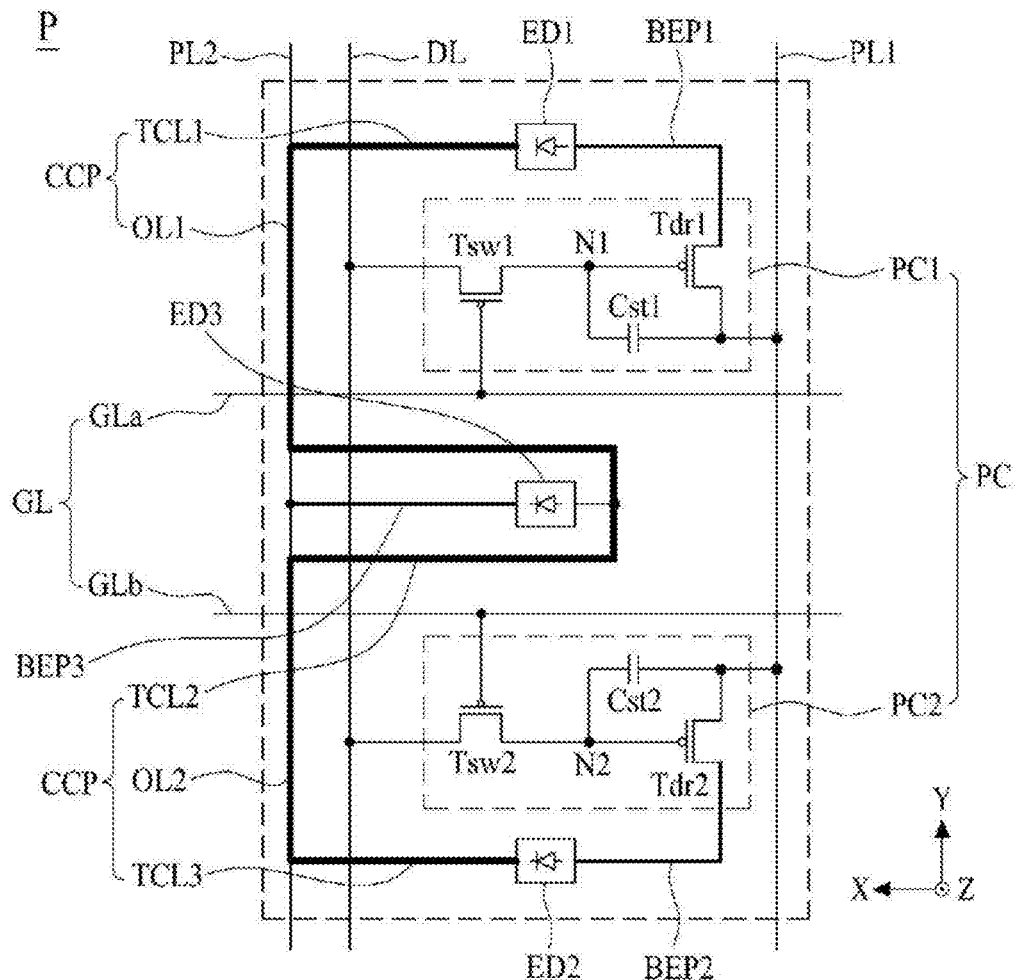
FIG. 2 is a circuit diagram for explaining one pixel shown in FIG. 1.
Figure 3:
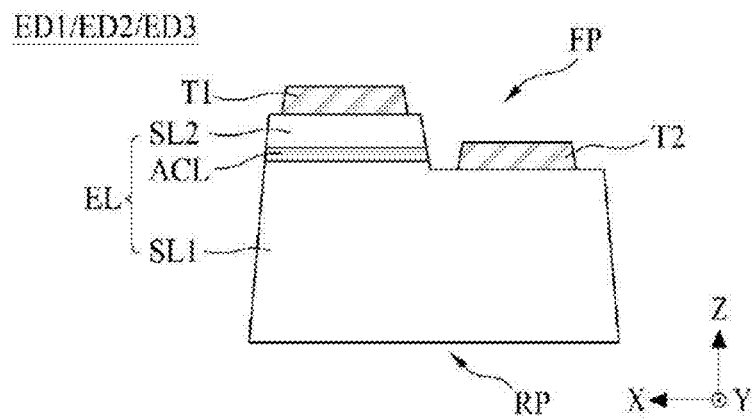
FIG. 3 is a cross sectional view illustrating first to third light emitting devices shown in FIG. 2.
Figure 4:
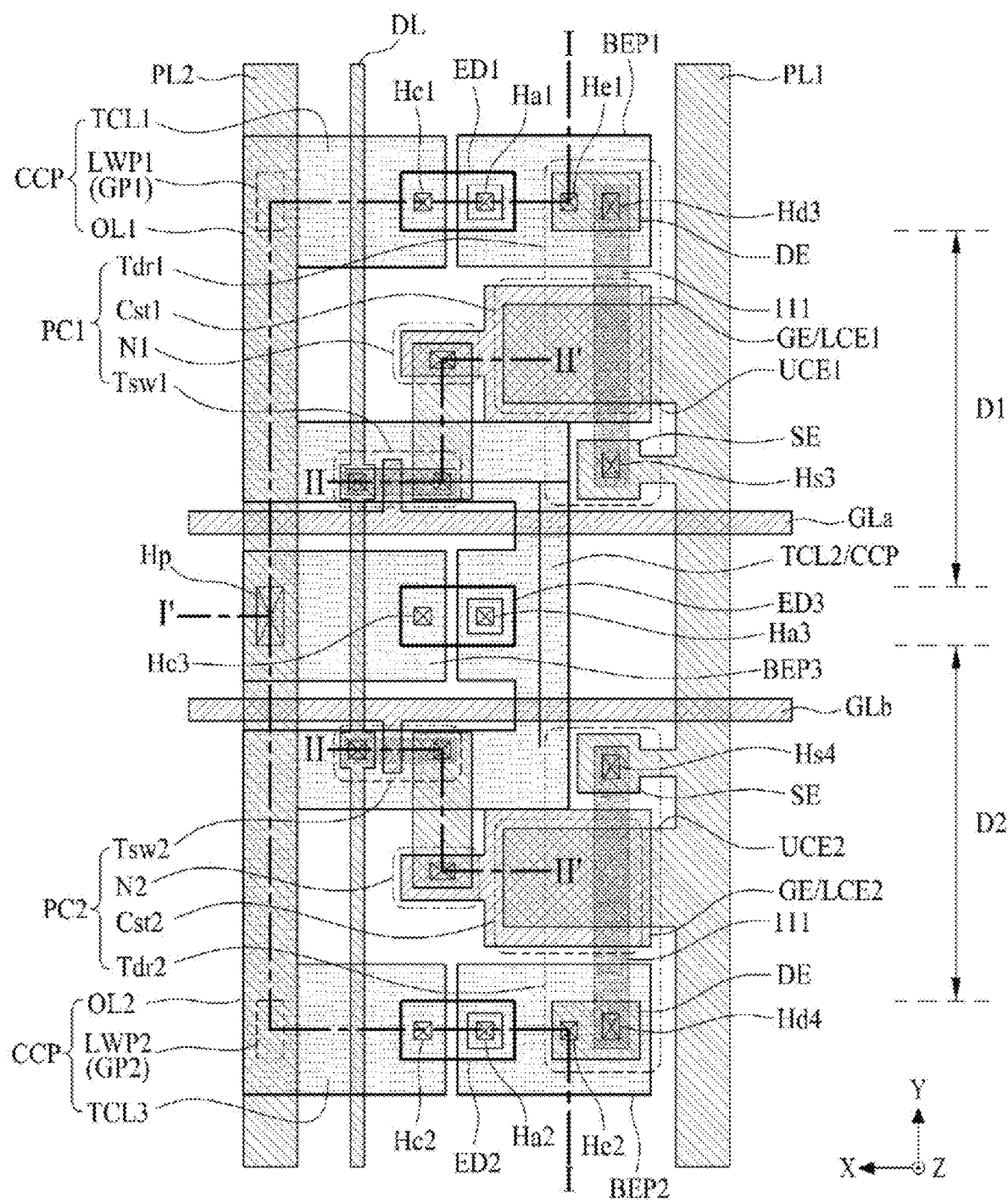
FIG. 4 illustrates a layout of the pixel shown in FIG. 2.

FIG. 2 is a circuit diagram for explaining one pixel shown in FIG. 1. FIG. 3 is a cross sectional view illustrating first to third light emitting devices shown in FIG. 2. FIG. 4 illustrates a layout of the pixel shown in FIG. 2. In the circuit diagram of FIG. 2, a black-colored circular dot indicates an electrically connected portion between lines, and an intersection portion of lines or overlapped portion of lines, in which the black-colored circular dot is not shown, indicates an electrically-disconnected (or insulated) portion between lines.

With reference to FIGS. 1 to 4, the pixel (P) according to one embodiment of the present disclosure may include a pixel circuit (PC), a first light emitting device (ED1), a second light emitting device (ED2), a common connection pattern (CCP), and a third light emitting device (ED3).

The pixel circuit (PC) may be connected with the adjacent data line (DL), the first and second gate lines (GLa, GLb) which intersect with the data line (DL), and the first driving power line (PL1) which is parallel to the data line (DL). In this case, the second gate line (GLb) may be a redundancy gate line which is prepared for a driving defect (or operation defect) of the first light emitting device (ED1). The pixel circuit (PC) may supply a data current corresponding to the data signal supplied to the data line (DL) to at least one of the first light emitting device (ED1) and the second light emitting device (ED2). The pixel circuit (PC) according to one embodiment of the present disclosure may include a first pixel circuit (PC1) and a second pixel circuit (PC2).

The first pixel circuit (PC1) is connected with the first gate line (GLa), the data line (DL), and the first driving power line (PL1). The first pixel circuit (PC1) supplies the data current corresponding to the data signal supplied through the data line (DL) to the first light emitting device (ED1) in response to a first gate signal supplied to the first gate line (GLa). The first pixel circuit (PC1) according to one embodiment of the present disclosure may include a first switching thin film transistor (Tsw1), a first driving thin film transistor (Tdr1), and a first capacitor (Cst1).

The first switching thin film transistor (Tsw1) may include a gate electrode connected with the adjacent first gate line (GLa), a first source/drain electrode connected with the data line (DL), and a second source/drain electrode connected with a first node (N1) which is connected with a gate electrode of the first driving thin film transistor (Tdr1). The first switching thin film transistor (Tsw1) is switched by the gate signal supplied to the first gate line (GLa), whereby the first switching thin film transistor (Tsw1) supplies the data signal, which is supplied through the data line (DL), to the gate electrode of the first driving thin film transistor (Tdr1).

The first driving thin film transistor is turned on by a voltage supplied from the first switching thin film transistor (Tsw1) and/or a voltage of the first capacitor (Cst1), to thereby control an amount of current flowing from the first driving power line (PL1) to the first light emitting device (ED1). The first driving thin film transistor (Tdr1) according to one embodiment of the present disclosure may include a gate electrode connected with the second source/drain electrode (or first node (N1)) of the first switching thin film transistor (Tsw1), a source electrode connected with the first driving power line (PL1), and a drain electrode connected with the first light emitting device (ED1). In this case, the first driving thin film transistor (Tdr1) is a P-type thin film transistor comprising a semiconductor layer doped with P-type dopant, but is not limited to this type. For example, the first driving thin film transistor (Tdr1) may be formed in an N-type thin film transistor comprising a semiconductor layer doped with N-type dopant. In case of the N-type first driving thin film transistor (Tdr1), a source electrode may be connected with the first light emitting device (ED1), and a drain electrode may be connected with the first driving power line (PL1).

The first capacitor (Cst1) is prepared in an overlap area between the gate electrode and the source electrode of the first driving thin film transistor (Tdr1). The first capacitor (Cst1) stores a voltage corresponding to the data signal supplied to the gate electrode of the first driving thin film transistor (Tdr1), and turns on the first driving thin film transistor (Tdr1) by the use of the stored voltage.

The second pixel circuit (PC2) is connected with the second gate line (GLb), the data line (DL), and the first driving power line (PL1). The second pixel circuit (PC2) supplies the data current corresponding to the data signal supplied through the data line (DL) to the second light emitting device (ED2) in response to a second gate signal supplied to the second gate line (GLb). The second pixel circuit (PC2) according to one embodiment of the present disclosure may include a second switching thin film transistor (Tsw2), a second driving thin film transistor (Tdr2), and a second capacitor (Cst2).

The second switching thin film transistor (Tsw2) may include a gate electrode connected with the adjacent second gate line (GLb), a first source/drain electrode connected with the data line (DL), and a second source/drain electrode connected with a second node (N2) which is connected with a gate electrode of the second driving thin film transistor (Tdr2). The second switching thin film transistor (Tsw2) is switched by the gate signal supplied to the second gate line (GLb), whereby the second switching thin film transistor (Tsw2) supplies the data signal, which is supplied through the data line (DL), to the gate electrode of the second driving thin film transistor (Tdr2).

The second driving thin film transistor (Tdr2) is turned-on by a voltage supplied from the second switching thin film transistor (Tsw2) and/or a voltage of the second capacitor (Cst2), to thereby control an amount of current flowing from the first driving power line (PL1) to the second light emitting device (ED2). The second driving thin film transistor (Tdr2) according to one embodiment of the present disclosure may include a gate electrode connected with the second source/drain electrode (or second node (N2)) of the second switching thin film transistor (Tsw2), a source electrode connected with the first driving power line (PL1), and a drain electrode connected with the second light emitting device (ED2). In this case, the second driving thin film transistor (Tdr2) is a P-type thin film transistor comprising a semiconductor layer doped with P-type dopant, but is not limited to this type. For example, the second driving thin film transistor (Tdr2) may be formed in an N-type thin film transistor comprising a semiconductor layer doped with N-type dopant. In case of the N-type second driving thin film transistor (Tdr2), a source electrode may be connected with the second light emitting device (ED2), and a drain electrode may be connected with the first driving power line (PL1).

The second capacitor (Cst2) is prepared in an overlap area between the gate electrode and the source electrode of the second driving thin film transistor (Tdr2). The second capacitor (Cst2) stores a voltage corresponding to the data signal supplied to the gate electrode of the second driving thin film transistor (Tdr2), and turns on the second driving thin film transistor (Tdr2) by the use of the stored voltage.

Selectively, each of the first pixel circuit (PC1) and the second pixel circuit (PC2) may further include at least one compensation thin film transistor for compensating a change of a threshold voltage in the driving thin film transistor (Tdr1, Tdr2), and may also include at least one auxiliary capacitor. Each of the first pixel circuit (PC1) and the second pixel circuit (PC2) may be additionally supplied with compensation power such as an initialization voltage in accordance with the number of thin film transistors and auxiliary capacitors. Accordingly, each of the first pixel circuit (PC1) and the second pixel circuit (PC2) according to an embodiment of the present disclosure may drive the light emitting device (ED1, ED2) in a current driving method identical to that of each pixel in an organic light emitting display apparatus, whereby it can be changed to a pixel circuit of the organic light emitting display apparatus that may be generally known to those in the art. For example, each of the first pixel circuit (PC1) and the second pixel circuit (PC2) according to the embodiment of the present disclosure may be changed to a pixel circuit in Korean Patent Application Registration No. 10-1749752, Korean Patent Application Publication No. 10-2017-0037729, Korean Patent Application Publication No. 10-2017-0062603, or Korean Patent Application Publication No. 10-2017-0081078.

The second pixel circuit (PC2) according to one embodiment of the present disclosure may be used as a redundancy circuit prepared for a driving defect of the first light emitting device (ED1), as caused by an electrical shock or a misalignment generated by a process of mounting the first light emitting device (ED1) on the substrate 100.

The first light emitting device (ED1) is electrically connected between the first pixel circuit (PC1) and the third light emitting device (ED3). The first light emitting device (ED1) may emit light by a current flowing from the first pixel circuit (PC1), that is, the first driving thin film transistor (Tdr1) to the second driving power line (PL2) through the third light emitting device (ED3). The first light emitting device (ED1) according to one embodiment of the present disclosure may be a micro light emitting diode chip emitting any one among red colored light, green colored light, blue colored light, and white colored light.

The first light emitting device (ED1) according to one embodiment of the present disclosure may include a first terminal connected with the first pixel circuit (PC1), and a second terminal connected with the common connection pattern (CCP). Accordingly, the first light emitting device (ED1) together with the first pixel circuit (PC1) may form a first light emitting portion of the pixel (P). In this case, with respect to a second direction (Y), the first light emitting portion may be disposed in an upper portion of the pixel (P) adjacent to the first gate line (GLa).

The second light emitting device (ED2) is electrically connected between the second pixel circuit (PC2) and the third light emitting device (ED3). The second light emitting device (ED2) may emit light by a current flowing from the second pixel circuit (PC2), that is, the second driving thin film transistor (Tdr2) to the second driving power line (PL2) through the third light emitting device (ED3). The second light emitting device (ED2) according to one embodiment of the present disclosure may be a micro light emitting diode chip of emitting the same colored light as that of the first light emitting device (ED1). The second light emitting device (ED2) may be used as a redundancy light emitting device prepared for a driving defect of the first light emitting device (ED1) caused by an electrical shock or a misalignment generated by a process of mounting the first light emitting device (ED1) on the substrate 100.

The second light emitting device (ED2) according to one embodiment of the present disclosure may include a first terminal connected with the second pixel circuit (PC2), and a second terminal connected with the common connection pattern (CCP). Accordingly, the second light emitting device (ED2) together with the second pixel circuit (PC2) may form a second light emitting portion of the pixel (P). In this case, with respect to the second direction (Y), the second light emitting portion may be disposed in a lower portion of the pixel (P) adjacent to the second gate line (GLb).

The third light emitting device (ED3) may be connected between the second driving power line (PL2) and the common connection pattern (CCP). For example, the third light emitting device (ED3) is electrically series-connected with the first light emitting device (ED1) through the common connection pattern (CCP), and is also electrically series-connected with the second light emitting device (ED2). Accordingly, the first light emitting device (ED1) and the second light emitting device (ED2) are parallel-connected with each other by the common connection pattern (CCP), and each of the first light emitting device (ED1) and the second light emitting device (ED2) is series-connected with the third light emitting device (ED3). The third light emitting device (ED3) according to one embodiment of the present disclosure may be a micro light emitting diode chip emitting the same colored light as that of the first light emitting device (ED1).

As the third light emitting device (ED3) is electrically series-connected with the first light emitting device (ED1) or the second light emitting device (ED2), a luminance in a light emission of the pixel (P) may be improved, and an input current supplied to the pixel (P) is reduced by half so that it may be possible to reduce power consumption, thereby reducing total power consumption of the light emitting diode display apparatus. And, if a driving defect occurs in the first light emitting device (ED1), the third light emitting device (ED3) is electrically series-connected with the second light emitting device (ED2) in accordance with the redundancy driving of the pixel (P), thereby enabling a normal driving of the pixel (P).

The third light emitting device (ED3) according to one embodiment of the present disclosure may include a first terminal connected with the common connection pattern (CCP), and a second terminal connected with the second driving power line (PL2). Thus, the third light emitting device (ED3) may form a third light emitting portion. In this case, with respect to the second direction (Y), the third light emitting portion may be disposed in a middle portion of the pixel (P) between the first gate line (GLa) and the second gate line (GLb). Accordingly, the third light emitting device (ED3) may be disposed between the first light emitting device (ED1) and the second light emitting device (ED2). In this case, if a distance (D1) between the first light emitting device (ED1) and the third light emitting device (ED3) and a distance (D2) between the second light emitting device (ED2) and the third light emitting device (ED3) are asymmetric with respect to the third light emitting device (ED3), luminance uniformity by each pixel may be deteriorated, thereby deteriorating picture quality such as through a line defect. Accordingly, the first, second and third light emitting devices (ED1, ED2, ED3) may be arranged in a straight line along the second direction (Y), and a first distance between the third light emitting device (ED3) and the first light emitting device (ED1) may be designed to be identical to a second distance between the third light emitting device (ED3) and the second light emitting device (ED2), so that it may be possible to prevent picture quality from being deteriorated by the asymmetric arrangement of the first to third light emitting devices (ED1, ED2, ED3).

The common connection pattern (CCP) is connected with the first light emitting device (ED1) and the second light emitting device (ED2) in common, whereby the first light emitting device (ED1) and the second light emitting device (ED2) are electrically parallel-connected with each other. Some of the common connection pattern (CCP) may be disposed on the substrate 100 while being overlapped with the second driving power line (PL2). If a driving defect occurs in the third light emitting device (ED3), some of the common connection pattern (CCP) may connect at least one of the first light emitting device (ED1) and the second light emitting device (ED2) with the second driving power line (PL2). In this case, some of the common connection pattern (CCP) may be used as a laser welding portion (or repair point) for laser welding by a laser repairing process.

The common connection pattern (CCP) according to one embodiment of the present disclosure may include a first terminal connection line (TCL1), a first overlap line (OL1), a second terminal connection line (TCL2), a second overlap line (OL2), and a third terminal connection line (TCL3).

The first terminal connection line (TCL1) is disposed on the substrate 100 while being parallel to the first direction (X), and is electrically connected with the second terminal of the first light emitting device (ED1). For example, one end of the first terminal connection line (TCL1) may be electrically connected with the second terminal of the first light emitting device (ED1). And, the other end of the first terminal connection line (TCL1) may be overlapped with the second driving power line (PL2).

The first overlap line (OL1) extends from the first terminal connection line (TCL1) while being parallel to the second direction (Y), and is overlapped with the second driving power line (PL2). For example, one end of the first overlap line (OL1) may be connected with the other end of the first terminal connection line (TCL1) while being disposed on the second driving power line (PL2). And, the other end of the first overlap line (OL1) may be disposed on the second driving power line (PL2) disposed between the first gate line (GLa) and the second gate line (GLb). Thus, if a driving defect occurs in the third light emitting device (ED3), the first overlap line (OL1), which is overlapped with the second driving power line (PL2), may be electrically connected with the second driving power line (PL2), whereby at least some area of the first overlap line (OL1) may be used as a first laser welding portion (LWP1, or repair point) for laser welding by a laser repairing process.

The second terminal connection line (TCL2) extends from the first overlap line (OL1), and is connected with the first terminal of the third light emitting device (ED3). For example, one end of the second terminal connection line (TCL2) may be connected with the other end of the first overlap line (OL1) while being disposed on the second driving power line (PL2). And, the other end of the second terminal connection line (TCL2) may be overlapped with the second driving power line (PL2). Also, a middle portion of the second terminal connection line (TCL2) between one end of the second terminal connection line (TCL2) and the other end of the second terminal connection line (TCL2) may be provided to surround the third light emitting device (ED3), and may be connected with the first terminal of the third light emitting device (ED3). The second terminal connection line (TCL2) according to one embodiment of the present disclosure may have a "⊃" shape on the plane structure.

The second overlap line (OL2) extends from the second terminal connection line (TCL2) while being parallel to the second direction (Y), and is overlapped with the second driving power line (PL2). For example, one end of the second overlap line (OL2) may be connected with the other end of the second terminal connection line (TCL2) while being disposed on the second driving power line (PL2). And, the other end of the second overlap line (OL2) may be disposed on the second driving power line (PL2). Thus, if a driving defect occurs in the third light emitting device (ED3), the second overlap line (OL2), which is overlapped with the second driving power line (PL2), may be electrically connected with the second driving power line (PL2), whereby at least some area of the second overlap line (OL2) may be used as a second laser welding portion (LWP2, or repair point) for laser welding by a laser repairing process.

The third terminal connection line (TCL3) extends from the other end of the second overlap line (OL2) while being parallel to the first direction (X), and is electrically connected with the second terminal of the second light emitting device (ED2). For example, one end of the third terminal connection line (TCL3) may be connected with the other end of the second overlap line (OL2) while being disposed on the second driving power line (PL2). And, the other end of the third terminal connection line (TCL3) may be electrically connected with the second terminal of the second light emitting device (ED2).

As the common connection pattern (CCP) is connected with the second terminal in each of the first light emitting device (ED1) and the second light emitting device (ED2), and the first terminal of the third light emitting device (ED3) in common, the first light emitting device (ED1) and the second light emitting device (ED2) are parallel-connected with each other, and each of the first light emitting device (ED1) and the second light emitting device (ED2) is series-connected with the third light emitting device (ED3). Thus, if a driving defect occurs in the third light emitting device (ED3), at least one of the first overlap line (OL1) and the second overlap line (OL2) may be electrically connected with the second driving power line (PL2) by a laser repairing process, to thereby improve reliability and yield of the pixel (P).

The pixel (P) according to one embodiment of the present disclosure may further include first to third bridge electrode patterns (BEP1, BEP2, BEP3). The first bridge electrode pattern (BEP1) electrically connects the first pixel circuit (PC1) with the first terminal of the first light emitting device (ED1). For example, the first bridge electrode pattern (BEP1) may electrically connect the source electrode of the first driving thin film transistor (Tdr1) with the first terminal of the first light emitting device (ED1).

The second bridge electrode pattern (BEP2) electrically connects the second pixel circuit (PC2) with the first terminal of the second light emitting device (ED2). For example, the second bridge electrode pattern (BEP2) may electrically connect the source electrode of the second driving thin film transistor (Tdr2) with the first terminal of the second light emitting device (ED2).

The third bridge electrode pattern (BEP3) electrically connects the second terminal of the third light emitting device (ED3) with the second driving power line (PL2). In this case, the second terminal connection line (TCL2) of the common connection pattern (CCP) extends from the first overlap line (OL1) to make a detour around the third bridge electrode pattern (BEP3), and is connected with the second overlap line (OL2).

The common connection pattern (CCP) and the first to third bridge electrode patterns (BEP1, BEP2, BEP3) may be formed of a transparent conductive material, for example, Indium Tin Oxide (ITO) or Indium Zinc Oxide (IZO), but are not limited to these materials.

With reference to FIG. 3, each of the first to third light emitting devices (ED1, ED2, ED3) according to one embodiment of the present disclosure may include an emission layer (EL), a first terminal (T1, or anode terminal), and a second terminal (T2, or cathode terminal).

The emission layer (EL) emits light by a re-bond of electron and hole in accordance with a current flowing between the first terminal (T1) and the second terminal (T2). The emission layer (EL) according to one embodiment of the present disclosure may include a first semiconductor layer (SL1), an active layer (ACL), and a second semiconductor layer (SL2).

The first semiconductor layer (SL1) provides the electron to the active layer (ACL). The first semiconductor layer (SL1) according to one embodiment of the present disclosure may be formed of n-GaN-based semiconductor material, for example, GaN, AlGaN, InGaN or AlInGaN. Herein, dopant used for a doping process of the first semiconductor layer (SL1) may be Si, Ge, Se, Te or C.

The active layer (ACL) is prepared on one side of the first semiconductor layer (SL1). The active layer (ACL) has a multi quantum well (MQW) structure comprising a well layer, and a barrier layer whose band gap is relatively higher than that of the well layer. The active layer (ACL) according to one embodiment of the present disclosure may have a multi quantum well structure such as InGaN/GaN.

The second semiconductor layer (SL2) is prepared on the active layer (ACL), and the second semiconductor layer (SL2) provides the hole to the active layer (ACL). The second semiconductor layer (SL2) according to one embodiment of the present disclosure may be formed of p-GaN-based semiconductor material, for example, GaN, AlGaN, InGaN or AlInGaN. Herein, dopant used for a doping process of the second semiconductor layer (SL2) may be Mg, Zn or Be.

The first terminal (T1) is prepared on the second semiconductor layer (SL2).

The second terminal (T2) is prepared on the other side of the first semiconductor layer (SL1), whereby the second terminal (T2) is electrically separated from the active layer (ACL) and the second semiconductor layer (SL2).

Each of the first terminal (T1) and the second terminal (T2) according to one embodiment of the present disclosure may be formed of a material comprising at least one selected from metal materials such as Au, W, Pt, Si, Ir, Ag, Cu, Ni, Ti, or Cr, and their alloys. Each of the first terminal (T1) and the second terminal (T2) according to another embodiment of the present disclosure may be formed of a transparent conductive material, for example, Indium Tin Oxide (ITO) or Indium Zinc Oxide (IZO), but is not limited to these materials.

Additionally, the first semiconductor layer (SL1), the active layer (ACL), and the second semiconductor layer (SL2) may be prepared in a sequential deposition structure on a semiconductor substrate. Herein, the semiconductor substrate includes a semiconductor material such as silicon substrate or sapphire substrate. This semiconductor substrate is used as a growth substrate for growing each of the first semiconductor layer (SL1), the active layer (ACL), and the second semiconductor layer (SL2), and is then separated from the first semiconductor layer (SL1) by a substrate separation process. Herein, the substrate separation process may be a laser lift off process or a chemical lift off process. Because the growth semiconductor substrate is removed from the light emitting device, the light emitting device may have a relatively small thickness, whereby the light emitting device may be disposed in each pixel (P).

Each of the first to third light emitting devices (ED1, ED2, ED3) emits light by a re-bond of electron and hole in accordance with a current flowing between the first terminal (T1) and the second terminal (T2). The light emitted from the first to third light emitting devices (ED1, ED2, ED3) passes through each of the first and second terminals T1, T2), and is then emitted to the outside. In other words, the light emitted from the first to third light emitting devices (ED1, ED2, ED3) passes through each of the first and second terminals (T1, T2), and is then emitted to the outside, whereby an image is displayed.

The first to third light emitting devices (ED1, ED2, ED3) may include a first portion (FP, or front portion) provided with the first and second terminals (T1, T2), and a second portion (RP, or rear portion) which is opposite to the first portion (FP). In this case, in comparison to the second portion (RP), the first portion (FP) is relatively farther away from the substrate 100. Herein, the first portion (FP) may be relatively smaller than the second portion (RP). In this case, each of the first to third light emitting devices (ED1, ED2, ED3) may have a trapezoid shape comprising an upper side corresponding to the first portion (FP), and a bottom side corresponding to the second portion (RP). Each of the first to third light emitting devices (ED1, ED2, ED3) may be fixed onto the substrate 100 by the use of an adhesion member.

Selectively, each of the first to third light emitting devices (ED1, ED2, ED3) is not limited to a lateral chip structure shown in FIG. 3. For example, each of the first to third light emitting devices (ED1, ED2, ED3) may have a vertical chip structure or a flip chip structure.

Figure 5:
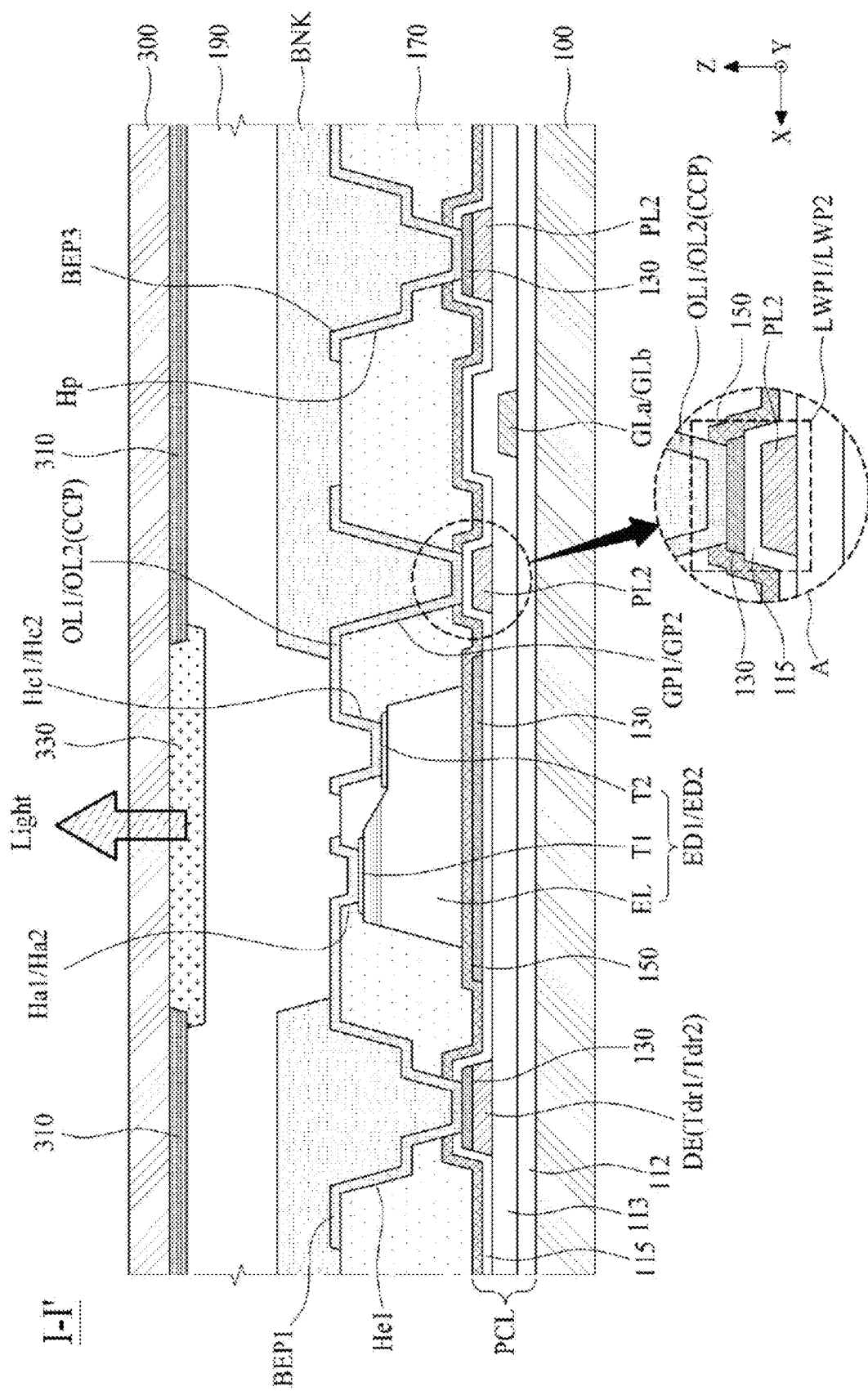
FIG. 5 is a cross sectional view along I-I' of FIG. 4.
Figure 6:
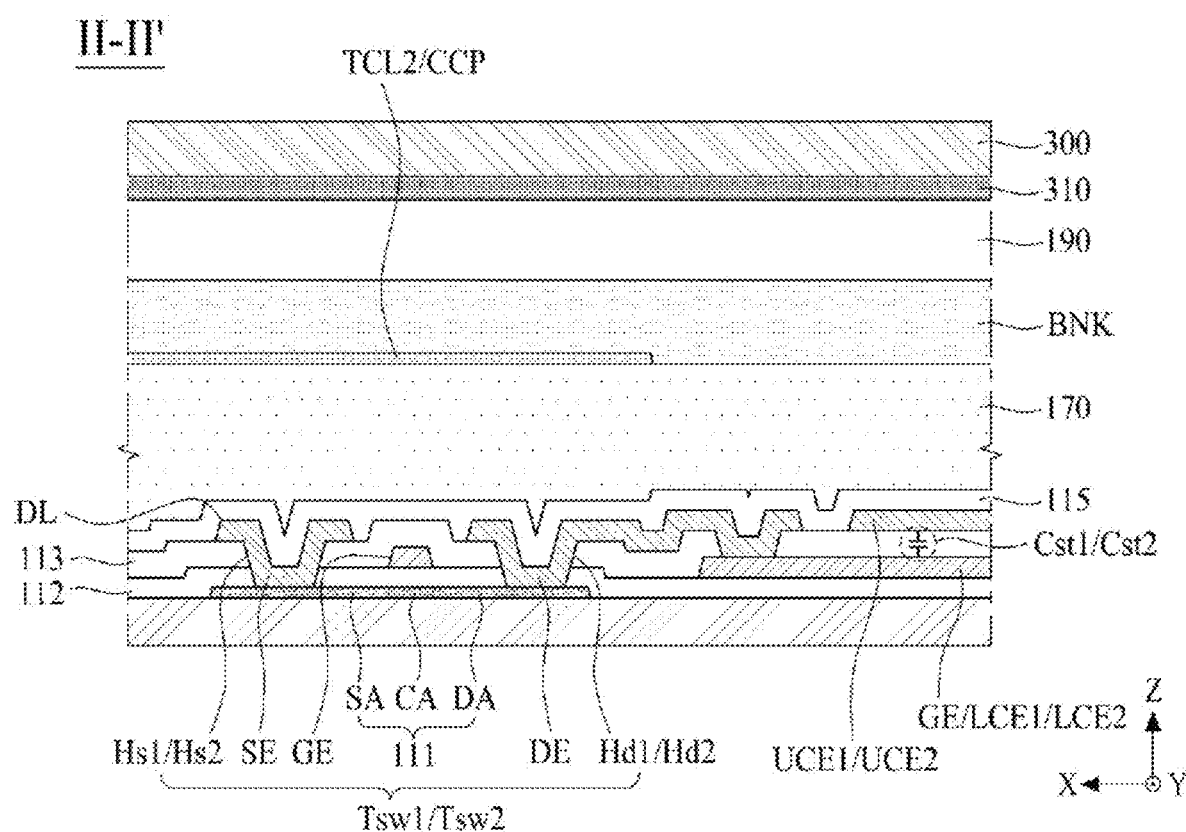
FIG. 6 is a cross sectional view along II-II' of FIG. 4.

FIG. 5 is a cross sectional view along of FIG. 4, and FIG. 6 is a cross sectional view along of FIG. 4, which illustrate a cross sectional structure of the pixel shown in FIG. 2.

With reference to FIGS. 5 and 6 in connection with FIG. 3, the pixel (P) of the light emitting diode display apparatus according to the embodiment of the present disclosure may include the substrate 100, a pixel circuit layer (PCL), a reflection pattern 130, an adhesive layer 150, the first to third light emitting devices (ED1, ED2, ED3), a planarization layer 170, the first to third bridge electrode patterns (BEP1, BEP2, BEP3), the common connection pattern (CCP), a bank pattern (BNK), a protection layer 190, and an encapsulation substrate 300.

The substrate 100 is a transistor array substrate, which may be formed of a glass material or a plastic material.

The pixel circuit layer (PCL) may include the data line (DL), the first and second gate lines (GLa, GLb), the first driving power line (PL1), the second driving power line (PL2), and the pixel circuit (PC).

The pixel circuit (PC) may include the first pixel circuit (PC1) comprising the first switching thin film transistor (Tsw1), the first driving thin film transistor (Tdr1) and the first capacitor (Cst1), and the second pixel circuit (PC2) comprising the second switching thin film transistor (Tsw2), the second driving thin film transistor (Tdr2) and the second capacitor (Cst2).

Each of the first and second switching thin film transistors (Tsw1, Tsw2) and the first and second driving thin film transistors (Tdr1, Tdr2) may include an active layer 111, a gate insulating layer 112, a gate electrode (GE), an insulating interlayer 113, a drain electrode (DE), a source electrode (SE), and a passivation layer 115.

The active layer 111 is formed in an island shape in a transistor area of the pixel, and is configured to have a length direction which is parallel to the first direction (X). For example, the active layer 111 includes a channel area (CA), a drain area (DA), and a source area (SA). In this case, the drain area (DA) and the source area (SA) may be apart from each other with the channel area (CA) interposed in between while being parallel to each other. The active layer 111 may be formed of any one among amorphous silicon, polycrystalline silicon and oxide, and may be formed of a semiconductor material doped with p-type dopant, but is not limited to these types.

The gate insulating layer 112 according to one embodiment of the present disclosure may be formed on an entire front surface of the substrate 100 including the active layer 111. The gate insulating layer 112 according to another embodiment of the present disclosure may be formed in an island shape only on the channel area (CA) of the active layer 111.

The gate electrode (GE) is formed on the gate insulating layer 112 while being overlapped with the channel area (CA) of the active layer 111. For example, the gate electrode (GE) of the first switching thin film transistor (Tsw1) may protrude from one side of the first gate line (GLa) toward the channel area (CA) of the active layer 111. The gate electrode (GE) of the second switching thin film transistor (Tsw2) may protrude from one side of the second gate line (GLb) toward the channel area (CA) of the active layer 111. The gate electrode (GE) of the first driving thin film transistor (Tdr1) may be parallel to the first gate line (GLa), and the gate electrode (GE) of the first driving thin film transistor (Tdr1) may serve as a first lower capacitor electrode (LCE1) of the first storage capacitor (Cst1). The gate electrode (GE) of the second driving thin film transistor (Tdr2) may be parallel to the second gate line (GLb), and the gate electrode (GE) of the second driving thin film transistor (Tdr2) may serve as a second lower capacitor electrode (LCE2) of the second storage capacitor (Cst2). According to one embodiment of the present disclosure, each of the first gate line (GLa), the second gate line (GLb) and the gate electrode (GE) may be formed in a single-layered structure of any one material selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

The insulating interlayer 113 may be formed on the entire surface of the gate insulating layer 112 while being configured to cover the gate electrode (GE). For example, the insulating interlayer 113 may be formed of an inorganic material such as silicon oxide (SiOx) or silicon nitride (SiNx).

The source electrode (SE) is electrically connected with the source area (SA) of the active layer 111 while being prepared in the insulating interlayer 113 being overlapped with the source area (SA) of the active layer 111. For example, the source electrode (SE) of the first switching thin film transistor (Tsw1) protrudes from a first side of the data line (DL) toward the source area (SA) of the active layer 111, and is electrically connected with the source area (SA) of the active layer 111 via a first source contact hole (Hs1). The source electrode (SE) of the second switching thin film transistor (Tsw2) protrudes from a second side of the data line (DL) toward the source area (SA) of the active layer 111, and is electrically connected with the source area (SA) of the active layer 111 via a second source contact hole (Hs2). The source electrode (SE) of the first driving thin film transistor (Tdr1) protrudes from a first side of the first driving power line (PL1) toward the source area (SA) of the active layer 111, and is electrically connected with the source area (SA) of the active layer 111 via a third source contact hole (Hs3). The source electrode (SE) of the second driving thin film transistor (Tdr2) protrudes from a second side of the first driving power line (PL1) toward the source area (SA) of the active layer 111, and is electrically connected with the source area (SA) of the active layer 111 via a fourth source contact hole (Hs4).

The drain electrode (DE) is electrically connected with the drain area (DA) of the active layer 111 while being prepared on the insulating interlayer 113 being overlapped with the drain area (DA) of the active layer 111. For example, the drain electrode (DE) of the first switching thin film transistor (Tsw1) is formed in an island shape on the insulating interlayer 113 being overlapped with the drain area (DA) of the active layer 111, whereby the drain electrode (DE) of the first switching thin film transistor (Tsw1) may be electrically connected with the drain area (DA) of the active layer 111 via a first drain contact hole (Hd1), and may be electrically connected with the gate electrode (GE) of the first driving thin film transistor (Tdr1) via a first node contact hole. Furthermore, the drain electrode (DE) of the second switching thin film transistor (Tsw2) is formed in an island shape on the insulating interlayer 113 being overlapped with the drain area (DA) of the active layer 111, whereby the drain electrode (DE) of the second switching thin film transistor (Tsw2) may be electrically connected with the drain area (DA) of the active layer 111 via a second drain contact hole (Hd2), and may be electrically connected with the gate electrode (GE) of the second driving thin film transistor (Tdr2) via a second node contact hole. Also, the drain electrode (DE) of the first driving thin film transistor (Tdr1) is formed in an island shape on the insulating interlayer 113 being overlapped with the drain area (DA) of the active layer 111, and is electrically connected with the drain area (DA) of the active layer 111 via a third drain contact hole (Hd3). Additionally, the drain electrode (DE) of the second driving thin film transistor (Tdr2) is formed in an island shape on the insulating interlayer 113 being overlapped with the drain area (DA) of the active layer 111, and is electrically connected with the drain area (DA) of the active layer 111 via a fourth drain contact hole (Hd4).

The second driving power line (PL2) together with the data line (DL), the drain electrode (DE), the source electrode (SE) and the first driving power line (PL1) may be formed on the insulating interlayer 113.

The data line (DL), the drain electrode (DE), the source electrode (SE), the first driving power line (PL1) and the second driving power line (PL2) may be formed of the same metal material. For example, each of the data line (DL), the drain electrode (DE), the source electrode (SE), the first driving power line (PL1) and the second driving power line (PL2) may be formed in a single-layered structure of any one material selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

The pixel circuit (PC) may further include a first upper capacitor electrode (UCE1) which protrudes from a third side of the first driving power line (PL1) toward the gate electrode (GE) of the first driving thin film transistor (Tdr1), and a second upper capacitor electrode (UCE2) which protrudes from a fourth side of the first driving power line (PL1) toward the gate electrode (GE) of the second driving thin film transistor (Tdr2). Accordingly, the first lower capacitor electrode (LCE1) and the first upper capacitor electrode (UCE1), which are overlapped with each other with the insulating interlayer 113 interposed in between, constitute the first storage capacitor (Cst1). A second lower capacitor electrode (LCE2) and the second upper capacitor electrode (UCE2), which are overlapped with each other with the insulating interlayer 113 interposed in between, constitute a second storage capacitor (Cst2).

The passivation layer 115 is formed on the substrate 100 while being configured to cover the remaining areas of the insulating interlayer 113, except for the second driving power line (PL2) and the drain electrode (DE) in each of the first and second driving thin film transistors (Tdr1, Tdr2). The passivation layer 115 according to one embodiment of the present disclosure may have a thickness of 0.04 μm (micrometers) or more than 0.04 μm (micrometers) in order to prevent an electrical short between the second driving power line (PL2) and the overlap line (OL1, OL2) in the laser welding portion (LWP1, LWP2) designed in the overlap line (OL1, OL2) of the common connection pattern (CCP). An electrical efficiency may be improved in accordance with the increase of thickness. However, in consideration of manufacturing cost and manufacturing process time, the passivation layer 115 according to one embodiment of the present disclosure may have a thickness of 0.04 μm (micrometers) ~0.5 μm (micrometers).

The reflection pattern 130 is disposed in the mounting areas of first to third devices which are preset on the passivation layer 115, and is overlapped with each of the first to third light emitting devices (ED1, ED2, ED3). For example, the reflection pattern 130 may be disposed between the substrate 100 and each of the first to third light emitting devices (ED1, ED2, ED3). Also, the reflection pattern 130 may be additionally deposited in the second driving power line (PL2) and the drain electrode (DE) in each of the first and second driving thin film transistors (Tdr1, Tdr2). In this case, the reflection pattern 130 may serve as a pattern for protecting the drain electrode (DE) and the second driving power line (PL2) for a process of patterning the drain electrode (DE) and the second driving power line (PL2).

The reflection pattern 130 according to one embodiment of the present disclosure may be formed of a metal material with relatively high reflectance. The reflection pattern 130 reflects light, which is emitted from each of the first to third light emitting devices (ED1, ED2, ED3), toward the encapsulation substrate 300. Accordingly, the light emitting diode display apparatus according to one embodiment of the present disclosure comprises the reflection pattern 130, to thereby realize a top emission structure.

Additionally, as shown in an expanded view (A) of FIG. 5, the reflection pattern 130 may be additionally disposed on the passivation layer 115 being overlapped with the laser welding portion (LWP1, LWP2) preset in the overlap line (OL1, OL2) of the common connection pattern (CCP). In this case, some areas of the overlap line (OL1, OL2) of the common connection pattern (CCP) may be directly connected with the reflection pattern 130, and the reflection pattern 130 is overlapped with the second driving power line (PL2) with the passivation layer 115 interposed in between so that it may be possible to prevent the passivation layer 115 overlapped with some areas of the overlap line (OL1, OL2) of the common connection pattern (CCP) from being removed by a patterning process of the planarization layer 170, and furthermore, to prevent an electrical short between the second driving power line (PL2) and the overlap line (OL1, OL2) of the common connection pattern (CCP) in accordance with the decrease in thickness of the passivation layer 115. Accordingly, the reflection pattern 130, which is electrically connected with the common connection pattern (CCP) and is overlapped with the second driving power line (PL2) with the passivation layer 115 interposed in between, may function as an etch stopping layer (or etch prevention layer) for preventing an etch of the passivation layer 115 overlapped with the laser welding portion (LWP1, LWP2).

The adhesive layer 150 is formed on the reflection pattern 130 disposed on the mounting areas of the first to third devices. The adhesive layer 150 may be formed on the remaining areas of the passivation layer 115 except for a pattern contact area designed on the second driving power line (PL2). In an example, the adhesive layer 150 may be formed of photo-curable adhesive resin.

Each of the first to third light emitting devices (ED1, ED2, ED3) is adhered to the adhesive layer 150 disposed in the corresponding device mounting area, and is then fixed into the inside of the pixel (P). In this case, the second portion (RP) in each of the first to third light emitting devices (ED1, ED2, ED3) is adhered to the adhesive layer 150, and the first terminal (T1) and the second terminal (T2) disposed in the first portion (FP) of each of the first to third light emitting devices (ED1, ED2, ED3) respectively confront the direction facing toward the substrate 10 and its opposite direction.

The planarization layer 170 having a relatively large thickness is formed on the substrate 100 while being configured to cover all the first to third light emitting devices (ED1, ED2, ED3), to thereby completely fix the first to third light emitting devices (ED1, ED2, ED3). The planarization layer 170 according to one embodiment of the present disclosure may be formed of an organic material such as benzocyclobutene or photo acryl. For convenience of process, the planarization layer 170 according to one embodiment of the present disclosure may be formed of photo acryl.

The planarization layer 170 includes a first electrode contact hole (He1), a second electrode contact hole (He2), first to third anode contact holes (Ha1, Ha2, Ha3), first to third cathode contact holes (Hc1, Hc2, HC3), and a power source contact hole (Hp).

The first electrode contact hole (He1) exposes some of the drain electrode (DE) of the first driving thin film transistor (Tdr1). The second electrode contact hole (He2) exposes some of the drain electrode (DE) of the second driving thin film transistor (Tdr2).

The first anode contact hole (Ha1) exposes some of the first terminal (T1) of the first light emitting device (ED1). The second anode contact hole (Ha2) exposes some of the first terminal (T1) of the second light emitting device (ED2). The third anode contact hole (Ha3) exposes some of the first terminal (T1) of the third light emitting device (ED3).

The first cathode contact hole (Hc1) exposes some of the second terminal (T2) of the first light emitting device (ED1). The second cathode contact hole (Hc2) exposes some of the second terminal (T2) of the second light emitting device (ED2). The third cathode contact hole (Hc3) exposes some of the second terminal (T2) of the third light emitting device (ED3).

The power source contact hole (Hp) exposes some of the second driving power line (PL2) disposed between the first gate line (GLa) and the second gate line (GLb).

Additionally, the planarization layer 170 may further include a first groove portion (GP1) overlapped with some of the second driving power line (PL2) in an upper portion of the pixel (P), and a second groove portion (GP2) overlapped with some of the second driving power line (PL2) in a lower portion of the pixel (P).

The first groove portion (GP1) exposes some of the passivation layer 115 (or reflection pattern 130) provided on a laser repairing area which is preset on some of the second driving power line (PL2) in the upper portion of the pixel (P). That is, the first groove portion (GP1) is provided to reduce and possibly minimize a thickness between some of the second driving power line (PL2) and the common connection pattern (CCP) to facilitate an electrical connection between some of the second driving power line (PL2) and the common connection pattern (CCP) for a laser repairing process.

The second groove portion (GP2) exposes some of the passivation layer 115 (or reflection pattern 130) provided on a laser repairing area which is preset on some of the second driving power line (PL2) in the lower portion of the pixel (P). That is, the second groove portion (GP2) is provided to reduce and possibly minimize a thickness between some of the second driving power line (PL2) and the common connection pattern (CCP) to facilitate an electrical connection between some of the second driving power line (PL2) and the common connection pattern (CCP) for a laser repairing process.

Selectively, the planarization layer 170 may include a lower planarization layer and an upper planarization layer in accordance with a total height (or thickness) of the light emitting device (ED1, ED2, ED3).

The lower planarization layer is configured to have a height (or thickness) which is lower than the total height of the light emitting device (ED1, ED2, ED3) so that it may be possible to additionally fix the light emitting device (ED1, ED2, ED3) fixed to the adhesive layer 150. The upper planarization layer is configured to have a height (or thickness) which is identical to or higher than that of the lower planarization layer so that it may be possible to cover all the first to third light emitting devices (ED1, ED2, ED3), to thereby completely fix the first to third light emitting devices (ED1, ED2, ED3). Accordingly, if the planarization layer includes the lower planarization layer and the upper planarization layer, the contact hole provided in the planarization layer 170 may have a double contact hole structure. In the double contact hole structure, the contact hole may be formed twice in the lower planarization layer and the upper planarization layer, whereby the second contact hole formed in the upper planarization layer may be relatively larger than the first contact hole formed in the lower planarization layer.

The first bridge electrode pattern (BEP1) is formed in an island shape on the planarization layer 170 to cover the first electrode contact hole (He1) and the first anode contact hole (Ha1), whereby the drain electrode (DE) of the first driving thin film transistor (Tdr1) is electrically connected with the first terminal (T1) of the first light emitting device (ED1) by the use of first bridge electrode pattern (BEP1).

The second bridge electrode pattern (BEP2) is formed in an island shape on the planarization layer 170 to cover the second electrode contact hole (He2) and the second anode contact hole (Ha2), whereby the drain electrode (DE) of the second driving thin film transistor (Tdr2) is electrically connected with the first terminal (T1) of the second light emitting device (ED2) by the use of second bridge electrode pattern (BEP2).

The third bridge electrode pattern (BEP3) is formed in an island shape on the planarization layer 170 to cover the third cathode contact hole (Hc3) and the power source contact hole (Hp), whereby the second driving power line (PL2) is electrically connected with the second terminal (T2) of the third light emitting device (ED3).

The common connection pattern (CCP) is formed in a zigzag line on the planarization layer 170 to sequentially cover the first cathode contact hole (Hc1), the second driving power line (PL2) disposed in the upper portion of the pixel (P), the first switching thin film transistor (Tsw1), the first gate line (GLa), the third anode contact hole (Ha3), the second gate line (GLb), the second switching thin film transistor (Tsw2), the second driving power line (PL2) disposed in the lower portion of the pixel (P), and the second cathode contact hole (Hc2), whereby the common connection pattern (CCP) is connected with the second terminal (T2) of the first light emitting device (ED1), the second terminal (T2) of the second light emitting device (ED2), and the first terminal (T1) of the third light emitting device (ED3) in common. In this case, the common connection pattern (CCP) may include the first terminal connection line (TCL1), the first overlap line (OL1), the second terminal connection line (TCL2), the second overlap line (OL2), and the third terminal connection line (TCL3), which are disposed on the planarization layer 170.

The first terminal connection line (TCL1) is connected with the second terminal (T2) of the first light emitting device (ED1) via the first cathode contact hole (Hc1). The first overlap line (OL1) extends from the first terminal connection line (TCL1), and is overlapped with the second driving power line (PL2) disposed in the upper portion of the pixel (P). Because some of the first overlap line (OL1) is formed in the exposed surface of the passivation layer 115 (or reflection pattern 130) through the first groove portion (GP1) of the planarization layer 170, some of the first overlap line (OL1) may be the first laser welding portion (LWP1), which is relatively close to the second driving power line (PL2) under the condition that the passivation layer 115 (or reflection pattern 130) is disposed in between.

The second terminal connection line (TCL2) extends from the first overlap line (OL1) and is configured to have "⊐" shape on the plane structure while being overlapped with the first switching thin film transistor (Tsw1), the first gate line (GLa), the third anode contact hole (Ha3), the second gate line (GLb) and the second switching thin film transistor (Tsw2) without any disconnection, whereby the second terminal connection line (TCL2) is connected with the first terminal (T1) of the third light emitting device (ED3) via the third anode contact hole (Ha3).

The second overlap line (OL2) extends from the second terminal connection line (TCL2), and is overlapped with the second driving power line (PL2) disposed in the lower portion of the pixel (P). Because some of the second overlap line (OL2) is formed in the exposed surface of the passivation layer 115 (or reflection pattern 130) through the second groove portion (GP2) of the planarization layer 170, some of the second overlap line (OL2) may be the second laser welding portion (LWP2), which is relatively close to the second driving power line (PL2) under the condition that the passivation layer 115 (or reflection pattern 130) is disposed in-between.

The third terminal connection line (TCL3) extends from the first overlap line (OL1) and is connected with the second terminal (T2) of the second light emitting device (ED2) via the second cathode contact hole (Hc2).

The bank pattern (BNK) defines an opening area (or light emission area) in accordance with the light emission in each of the first to third light emitting devices (ED1, ED2, ED3). The bank pattern (BNK) is formed on the planarization layer 170 and is configured to cover the remaining areas except for the opening area defined on each of the first to third light emitting devices (ED1, ED2, ED3). For example, the bank pattern (BNK) may be formed in a mesh structure or matrix structure comprising an opening portion overlapped with the opening area defined on each of the first to third light emitting devices (ED1, ED2, ED3).

The bank pattern (BNK) may prevent a mixture of color among the adjacent pixels (P) so that it may be possible to reduce a black luminance of the display apparatus, to thereby realize a real black in the display apparatus. To this end, the bank pattern (BNK) may include a light-shielding material or a light-absorbing material. For example, the bank pattern (BNK) may be a black matrix pattern.

The protection layer 190 is formed to cover the bank pattern (BNK) and the opening area in each of the first to third light emitting devices (ED1, ED2, ED3). The protection layer 190 according to one embodiment of the present disclosure may be obtained by coating heat and/or photo curable resin of liquid type onto an entire upper surface of the substrate 100, and carrying out a curing process using heat and/or photo. In this case, the curing process for the protection layer 190 may be carried out after a bonding process of bonding the encapsulation substrate 300 to the protection layer 190 coated onto the upper surface of the substrate 100. For the bonding process between the substrate 100 and the encapsulation substrate 300, the protection layer 190 may serve as a buffer capable of preventing the encapsulation substrate 300 from being pressed down. For example, the protection layer 190 may be an optical clear adhesive (OCA) or optical clear resin (OCR), but is not limited to these types.

The encapsulation substrate 300 is disposed to cover the remaining areas except a pad portion of the substrate 100, to thereby protect a pixel array prepared on the substrate 100. The encapsulation substrate 300 according to one embodiment of the present disclosure may include a black matrix 310. The black matrix 310 defines the opening area in each pixel (P) prepared in the substrate 100. That is, the black matrix 310 is prepared on the encapsulation substrate 300 which is overlapped with the remaining light-shielding area except the opening area in each pixel (P), to thereby prevent a mixture of color in the neighboring opening areas. The black matrix 310 according to one embodiment of the present disclosure may include a plurality of first light-shielding patterns configured to cover the plurality of gate lines (GL) and the pixel circuit (PC) in each pixel (P), a plurality of second light-shielding patterns configured to cover the plurality of data lines (DL) and the plurality of driving power lines (PL1, PL2), and a third light-shielding pattern configured to cover the periphery of the encapsulation substrate 300. Herein, the first to third light-shielding patterns may be prepared in the same layer, whereby the black matrix 310 may have a mesh pattern.

Additionally, the encapsulation substrate 300 may further include a light extraction layer 330 prepared in the opening area defined by the black matrix 310. The light extraction layer 330 is formed of a transparent material, whereby the light extraction layer 330 extracts light emitted from the pixel (P) to the outside, and also reduces and possibly minimizes a step difference between the opening area and the black matrix 310 prepared in the encapsulation substrate 300.

Meanwhile, if the light emitting devices (ED1, ED2, ED3) disposed in each pixel (P) emit white colored light, the encapsulation substrate 300 includes a color filter layer prepared in the opening area instead of the light extraction layer 330. In this case, the color filter layer may include a red color filter, a green color filter and a blue color filter corresponding to the respective colors defined in the plurality of pixels (P). In the white colored light emitted from the pixel (P), the color filter layer transmits only the light whose wavelength corresponds to the color of the corresponding pixel therethrough.

Figure 7:
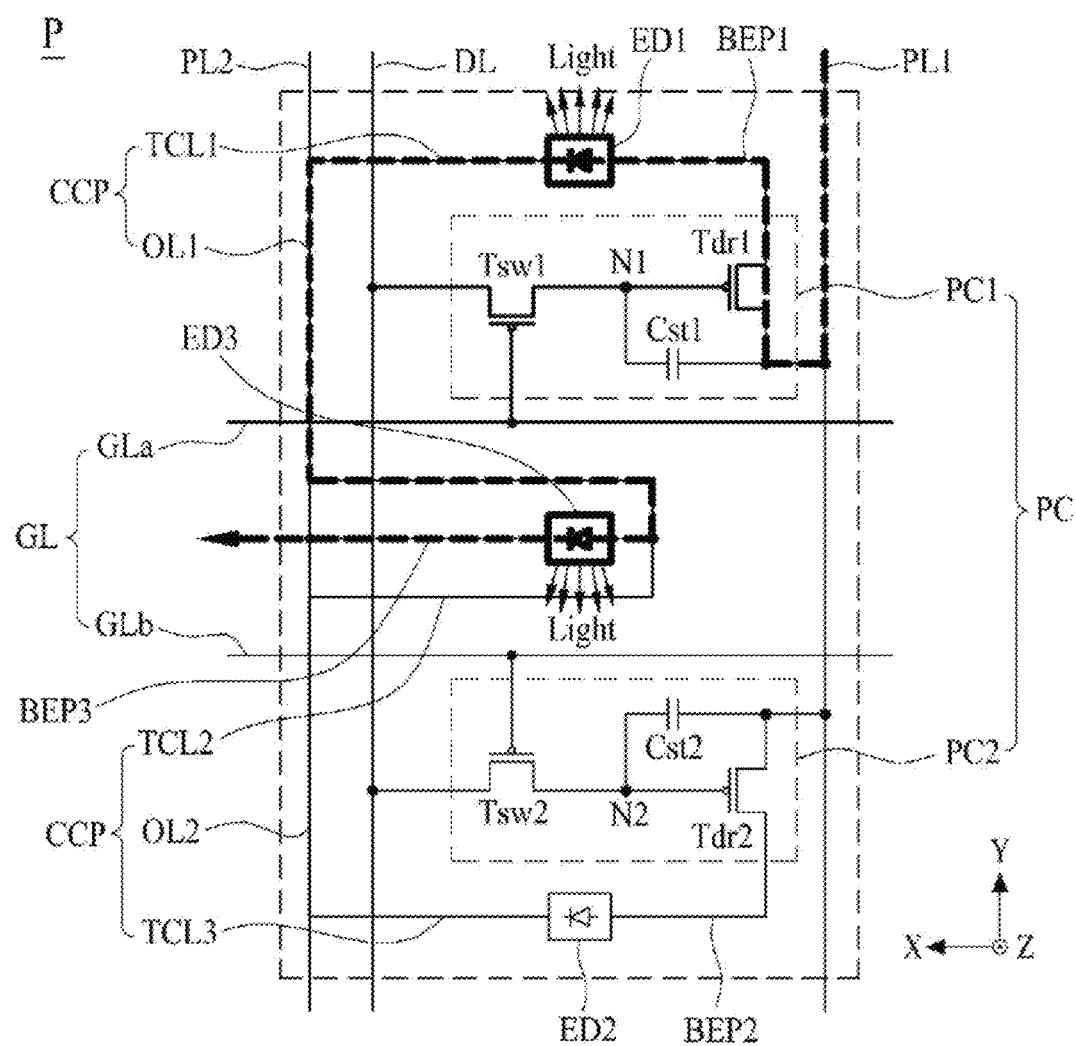
FIG. 7 illustrates a light emission of a normal pixel in the light emitting diode display apparatus according to one embodiment of the present disclosure.

FIG. 7 illustrates a light emission of a normal pixel in the light emitting diode display apparatus according to one embodiment of the present disclosure. As shown in FIG. 7, if the pixel circuit (PC), the first light emitting device (ED1), and the third light emitting device (ED3) in the pixel (P) are normally driven for the manufacturing process, and also normally driven even after the manufacturing process, the first light emitting device (ED1) and the third light emitting device (ED3) in the pixel (P) normally emit light by the data current which is output from the first pixel circuit (PC1) in accordance with the gate signal supplied to the first gate line (GLa) and the data signal supplied to the data line (DL). If the first light emitting device (ED1) and the third light emitting device (ED3) are normally driven, the second light emitting portion comprising the second pixel circuit (PC2) and the second light emitting device (ED2) may be used as the redundancy circuit which is not operated.

Figure 8:
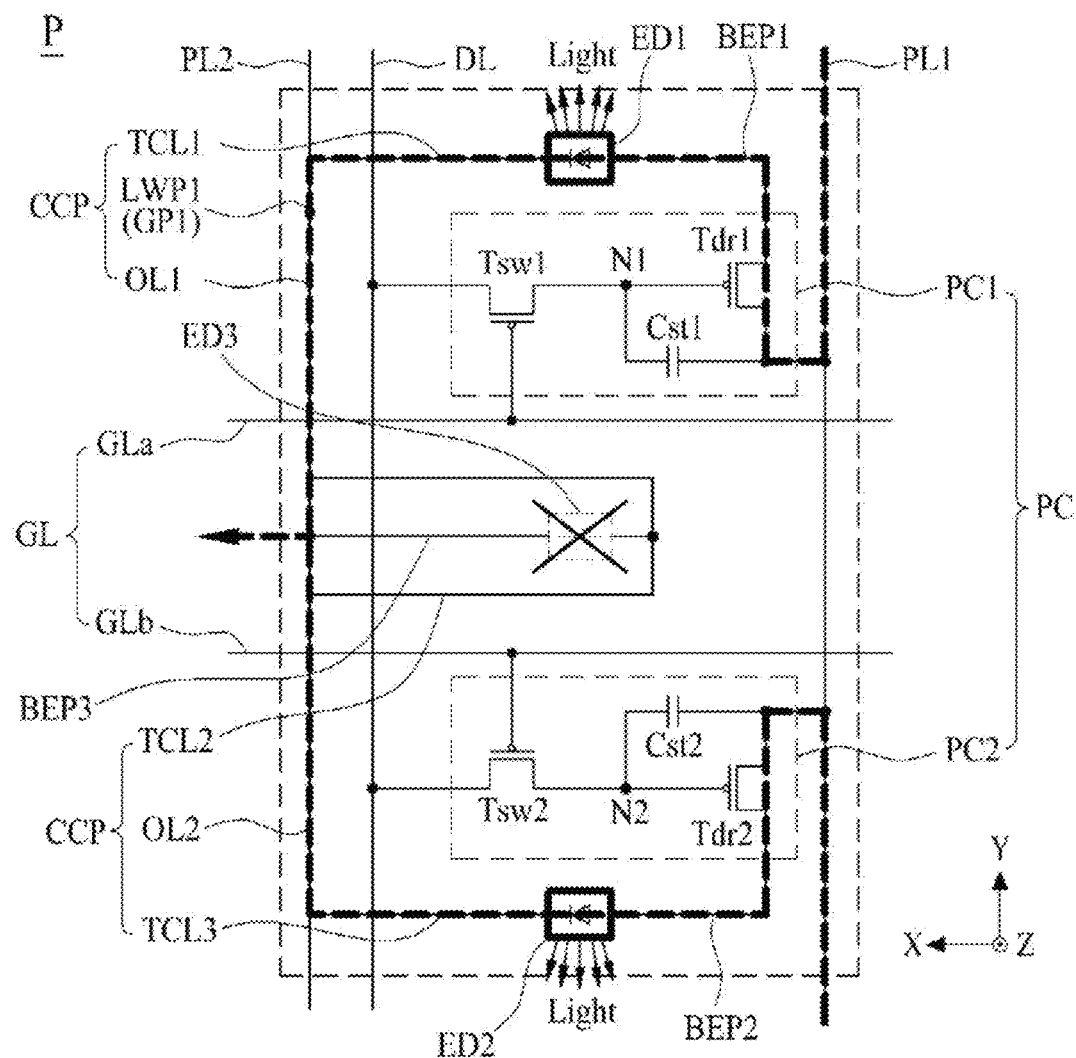
FIG. 8 illustrates a light emission of a repair pixel in the light emitting diode display apparatus according to one embodiment of the present disclosure.
Figure 9:
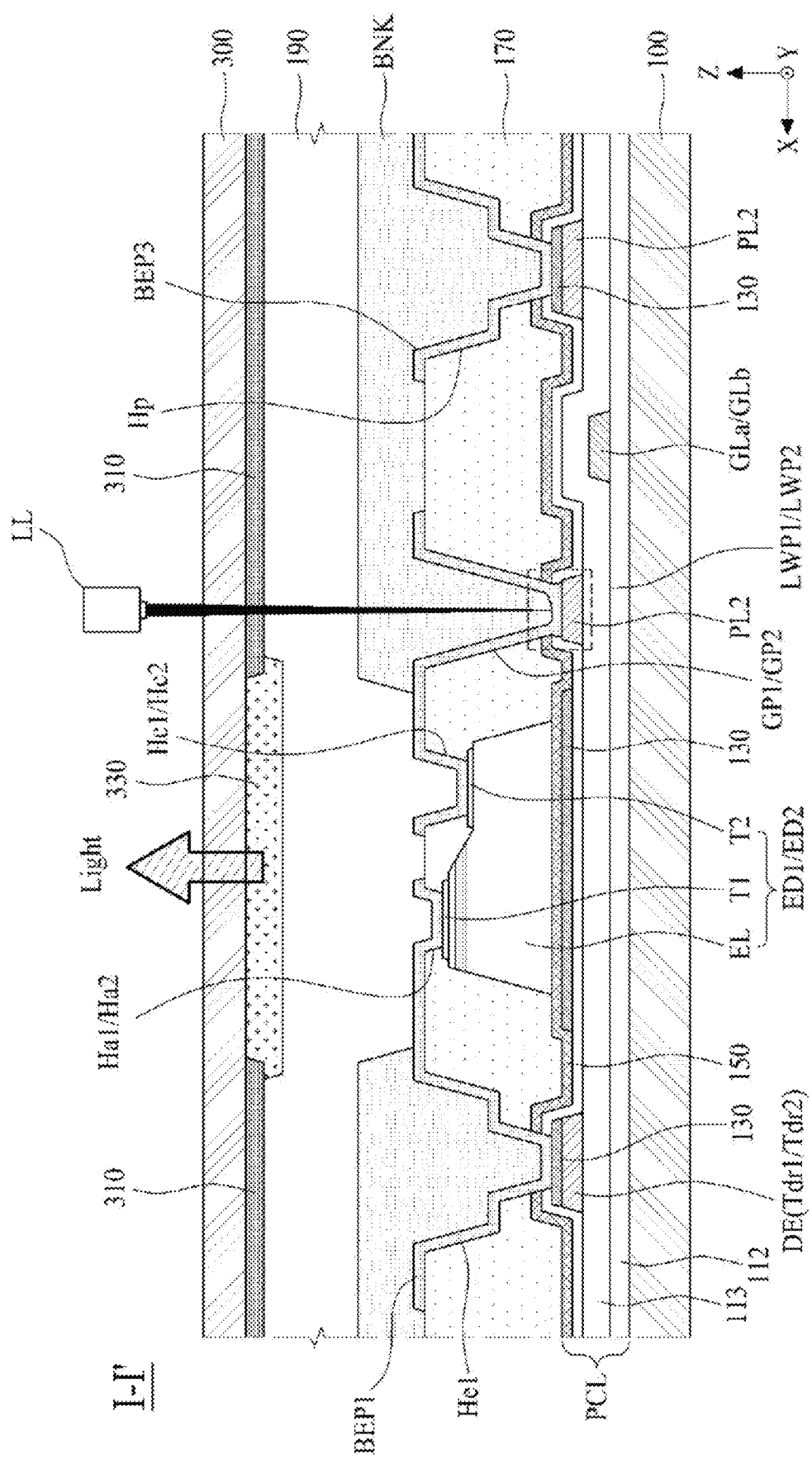
FIG. 9 illustrates a repairing method of the repair pixel shown in FIG. 8.

FIG. 8 illustrates a light emission of a repair pixel in the light emitting diode display apparatus according to one embodiment of the present disclosure. FIG. 9 illustrates a repairing method of the repair pixel shown in FIG. 8. With reference to FIGS. 8 and 9 in connection with FIG. 4, if a driving defect such as a short or opening state occurs in the third light emitting device (ED3) of the pixel (P) for the manufacturing process and after the manufacturing process, an image is not displayed on the pixel (P) due to the driving defect of the third light emitting device (ED3). Thus, if the driving defect occurs in the third light emitting device (ED3) of the pixel (P), laser (LL) is irradiated onto the laser welding portion (LWP1, LWP2) for at least one of the first overlap line (OL1) and the second overlap line (OL2) of the common connection pattern (CCP) overlapped with the second driving power line (PL2), whereby at least one of the first overlap line (OL1) and the second overlap line (OL2) may be electrically connected with the second driving power line (PL2). Accordingly, the first light emitting device (ED1) of the pixel (P) normally emits light by the data current which is output from the first pixel circuit (PC1) in accordance with the gate signal supplied to the first gate line (GLa) and the data signal supplied to the data line (DL), and simultaneously, the second light emitting device (ED2) normally emits light by the data current which is output from the second pixel circuit (PC2) in accordance with the gate signal supplied to the second gate line (GLb) and the data signal supplied to the data line (DL).

According to the present disclosure, it may be possible to provide a light emitting diode display apparatus which is capable of repairing the defective pixel, and improving reliability and yield.

Figure 10:
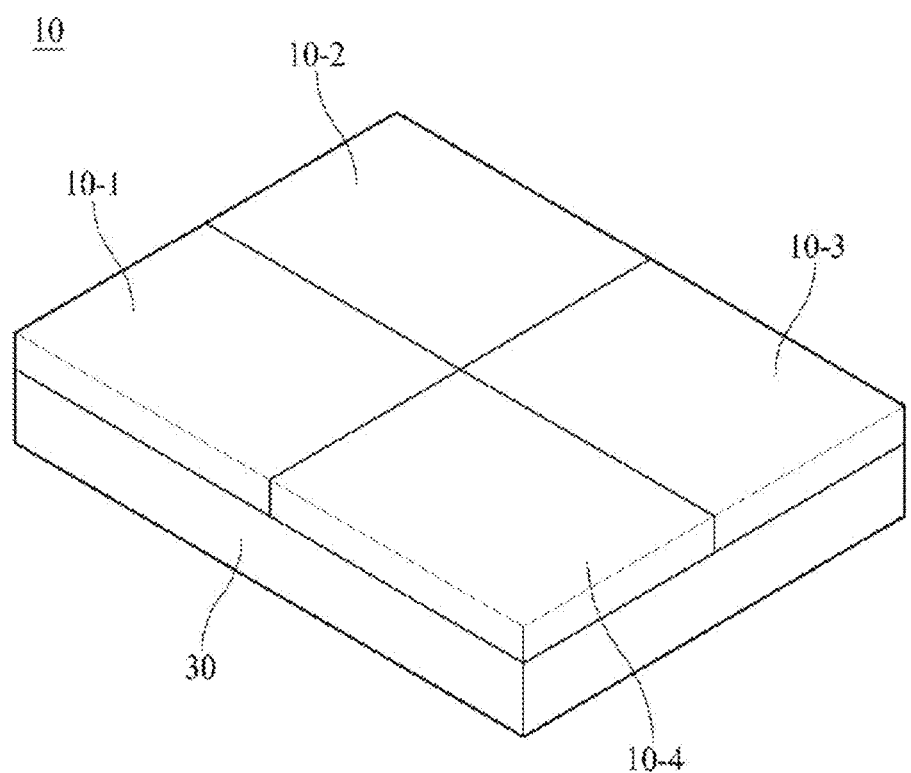
FIG. 10 illustrates a multi screen display apparatus according to one embodiment of the present disclosure.

FIG. 10 illustrates a multi screen display apparatus according to one embodiment of the present disclosure. With reference to FIG. 10, the multi screen display apparatus 10 according to one embodiment of the present disclosure may include a plurality of screen modules 10-1, 10-2, 10-3 and 10-4, and a housing 30.

The plurality of screen modules 10-1, 10-2, 10-3 and 10-4 are arranged in an N×M configuration (where 'N' is an integer of 2 or more than 2, and 'M' is an integer of 2 or more than 2), whereby each of the plurality of screen modules 10-1, 10-2, 10-3 and 10-4 may display an individual image, or one image may be dividedly displayed on the plurality of screen modules 10-1, 10-2, 10-3 and 10-4. Each of the plurality of screen modules 10-1, 10-2, 10-3 and 10-4 includes the light emitting diode display apparatus according to an embodiment of the present disclosure, as shown in FIGS. 1 to 9, whereby a repetitive description for the same parts will be omitted.

Each of the plurality of screen modules 10-1, 10-2, 10-3 and 10-4 includes the light emitting diode display apparatus according to an embodiment of the present disclosure. The plurality of screen modules 10-1, 10-2, 10-3 and 10-4 according to one embodiment of the present disclosure may be closely adhered at their lateral surfaces to one another, and may be combined with one another. In this case, the lateral surfaces of the neighboring screen modules 10-1, 10-2, 10-3 and 10-4 may be combined by the use of adhesive or double-sided tape.

The housing 30 supports rear edges of the plurality of screen modules 10-1, 10-2, 10-3 and 10-4, and covers rear surfaces of the plurality of screen modules 10-1, 10-2, 10-3 and 10-4. The housing 30 according to one embodiment of the present disclosure includes a housing plate configured to cover the rear surfaces of the plurality of screen modules 10-1, 10-2, 10-3 and 10-4, and a housing sidewall prepared while being vertical to the housing plate and configured to support the rear edges of the plurality of screen modules 10-1, 10-2, 10-3 and 10-4.

The housing plate may be formed in a single body configured to cover an entire rear surface of the plurality of screen modules 10-1, 10-2, 10-3 and 10-4, or may be provided with a plurality of division plates overlapped with the respective rear surfaces of the plurality of screen modules 10-1, 10-2, 10-3 and 10-4.

The housing sidewall is vertically provided on an upper surface of the housing plate overlapped with the rear edges of the plurality of screen modules 10-1, 10-2, 10-3 and 10-4, and is configured to individually support the rear edges of the plurality of screen modules 10-1, 10-2, 10-3 and 10-4. In this case, the housing sidewall may support the rear edges of the plurality of screen modules 10-1, 10-2, 10-3 and 10-4 by the use of supporting member such as elastic member, foam pad or double-sided tape.

The multi screen display apparatus comprising the screen modules formed of the light emitting diode display apparatus according to an embodiment of the present disclosure enables immersion improvement in an image displayed on a large-sized screen, and realizes size expandability.

The light emitting diode display apparatus according to the present disclosure may be explained as follows.

According to an embodiment of the present disclosure, a light emitting diode display apparatus comprises a pixel disposed on a substrate and configured to display an image, wherein the pixel includes a first light emitting portion configured to connect with a first gate line disposed in a first direction, a data line disposed in a second direction which is perpendicular to the first direction, and a first driving power line which is parallel to the data line, a second light emitting portion configured to connect a second gate line which is parallel to the first gate line, the data line, and the first driving power line, a common connection pattern configured to connect with the first light emitting portion and the second light emitting portion in common, and a third light emitting portion configured to connect between a second driving power line and the common connection pattern, wherein some of the common connection pattern may be overlapped with the second driving power line.

According to one or more embodiments of the present disclosure, the third light emitting portion may be disposed between the first gate line and the second gate line.

According to one or more embodiments of the present disclosure, the first light emitting portion may include a first pixel circuit configured to connect with the first gate line, the data line, and the first driving power line, and a first light emitting device including a first terminal connected with the first pixel circuit, and a second terminal connected with the common connection pattern.

According to one or more embodiments of the present disclosure, the second light emitting portion may include a second pixel circuit configured to connect with the second gate line, the data line, and the first driving power line, and a second light emitting device including a first terminal connected with the second pixel circuit, and a second terminal connected with the common connection pattern.

According to one or more embodiments of the present disclosure, the third light emitting portion may include a third light emitting device comprising a first terminal connected with the common connection pattern, and a second terminal connected with the second driving power line.

According to one or more embodiments of the present disclosure, the pixel may further include a first bridge electrode pattern configured to connect the first pixel circuit with the first terminal of the first light emitting device, a second bridge electrode pattern configured to connect the second pixel circuit with the first terminal of the second light emitting device, and a third bridge electrode pattern configured to connect the second terminal of the third light emitting device with the second driving power line, wherein the remaining areas except some of the common connection pattern may be made a detour around the third bridge electrode pattern.

According to the embodiment of the present disclosure, a light emitting diode display apparatus comprises a pixel disposed on a substrate and configured to display an image, wherein the pixel includes a pixel circuit configured to connect with a data line, first and second gate lines which are perpendicular to the data line, and a first driving power line which is parallel to the data line, first and second light emitting devices connected with the pixel circuit, a common connection pattern connected with the first light emitting device and the second light emitting device in common, and a third light emitting device connected between a second driving power line and the common connection pattern, wherein at least one of the first and second light emitting devices may be connected with the second driving power line via the common connection pattern.

According to one or more embodiments of the present disclosure, some the third light emitting device may be disposed between the first gate line and the second gate line.

According to one or more embodiments of the present disclosure, some of the common connection pattern may be electrically connected with the second driving power line by a laser repair process.

According to one or more embodiments of the present disclosure, the third light emitting device may be disposed between the first light emitting device and the second light emitting device, and the first light emitting device, the second light emitting device, and the third light emitting device may be disposed in a straight line along the second direction.

According to one or more embodiments of the present disclosure, the third light emitting device may be disposed between the first light emitting device and the second light emitting device, and a first distance between the third light emitting device and the first light emitting device may be identical to a second distance between the third light emitting device and the second light emitting device.

According to one or more embodiments of the present disclosure, the common connection pattern may include a first terminal connection line connected with a second terminal of the first light emitting device, a first overlap line configured to be extending from the first terminal connection line and overlapped with the second driving power line, a second terminal connection line configured to be extending from the first overlap line and connected with a first terminal of the third light emitting device, a second overlap line configured to be extending from the second terminal connection line and overlapped with the second driving power line, and a third terminal connection line configured to be extending from the second overlap line and connected with a second terminal of the second light emitting device According to one or more embodiments of the present disclosure, at least one of the first overlap line and the second overlap line may be electrically connected with the second driving power line by a laser repairing process.

According to one or more embodiments of the present disclosure, the light emitting diode display apparatus may further comprise a passivation layer configured to cover the second driving power line, and a planarization layer configured to cover the first to third light emitting devices and to have a groove portion prepared between the second driving power line and some of each of the first and second overlap lines, wherein some of each of the first overlap line and the second overlap line may be disposed in the groove portion of the planarization layer, and may be overlapped with the second driving power line under the condition that the passivation layer is interposed in-between.

According to one or more embodiments of the present disclosure, each of the first light emitting device, the second light emitting device, and the third light emitting device may be formed of a micro light emitting diode chip.

According to one or more embodiments of the present disclosure, the pixel may further include a reflection pattern disposed between the substrate and each of the first, second, and third light emitting devices.

According to one or more embodiments of the present disclosure, the light emitting diode display apparatus may further comprise a passivation layer configured to cover the second driving power line, and a planarization layer configured to cover the first to third light emitting devices and to have a groove portion prepared between the second driving power line and some of each of the first overlap line and the second overlap line, wherein some of each of the first overlap line and the second overlap line may be disposed in the groove portion of the planarization layer, and is overlapped with the second driving power line under the condition that the passivation layer is interposed in-between, and the reflection pattern may be additionally disposed between the passivation layer and some of each of the first overlap line and the second overlap line.

According to one or more embodiments of the present disclosure, the pixel may further include an adhesive layer disposed between the reflection pattern and each of the first, second, and third light emitting devices.

According to the embodiment of the present disclosure, a multi screen display apparatus comprises a plurality of screen modules which are closely adhered at their lateral surfaces to one another, wherein each of the plurality of screen modules includes a light emitting diode display apparatus, wherein the light emitting diode display apparatus comprises a pixel disposed on a substrate and configured to display an image, wherein the pixel includes a pixel circuit connected with a data line, first and second gate lines which are perpendicular to the data line, and a first driving power line which is parallel to the data line, first and second light emitting devices connected with the pixel circuit, a common connection pattern connected with the first light emitting device and the second light emitting device in common, and a third light emitting device connected between the second driving power line and the common connection pattern, wherein some of the common connection pattern may be overlapped with the second driving power line.

According to one embodiment of the present disclosure, some of the common connection pattern may be electrically connected with the second driving power line by a laser repairing process.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting diode display apparatus, comprising:
   a pixel disposed on a substrate, the pixel being configured to display an image, the pixel including:
      a first light emitting portion configured to connect to:
         a first gate line disposed in a first direction;
         a data line disposed in a second direction perpendicular to the first direction; and
         a first driving power line parallel to the data line;
      a second light emitting portion configured to connect to:
         the data line;
         the first driving power line; and
         a second gate line parallel to the first gate line;
      a common connection pattern configured to connect the first light emitting portion and the second light emitting portion in common; and
      a third light emitting portion configured to connect between a second driving power line and the common connection pattern,
      wherein at least a portion of the common connection pattern is configured to overlap the second driving power line in plan view.

2. The light emitting diode display apparatus according to claim 1, wherein the third light emitting portion is disposed between the first light emitting portion and the second light emitting portion.

3. The light emitting diode display apparatus according to claim 1, wherein the first light emitting portion includes:
   a first pixel circuit configured to connect to:
      the first gate line;
      the data line; and
      the first driving power line; and
   a first light emitting device including:
      a first terminal connected to the first pixel circuit; and
      a second terminal connected to the common connection pattern.

4. The light emitting diode display apparatus according to claim 3, wherein the second light emitting portion includes:
   a second pixel circuit configured to connect to:
      the second gate line;
      the data line; and
      the first driving power line; and
   a second light emitting device including:
      a first terminal connected to the second pixel circuit; and
      a second terminal connected to the common connection pattern.

5. The light emitting diode display apparatus according to claim 4, wherein the third light emitting portion includes a third light emitting device including:
   a first terminal connected to the common connection pattern; and
   a second terminal connected to the second driving power line.

6. The light emitting diode display apparatus according to claim 5, wherein the pixel further includes:
   a first bridge electrode pattern configured to connect the first pixel circuit with the first terminal of the first light emitting device;
   a second bridge electrode pattern configured to connect the second pixel circuit with the first terminal of the second light emitting device; and a third bridge electrode pattern configured to connect the second terminal of the third light emitting device with the second driving power line, wherein the common connection pattern is configured to detour around the third bridge electrode pattern.

7. A light emitting diode display apparatus, comprising:
a pixel disposed on a substrate, the pixel being configured to display an image, the pixel including:
a pixel circuit connected to:
a data line;
first and second gate lines perpendicular to the data line; and
a first driving power line parallel to the data line;
first and second light emitting devices, each including a first terminal and a second terminal, the first and second light emitting devices being configured to connect to the pixel circuit;
a common connection pattern configured to connect the first light emitting device and the second light emitting device in common; and
a third light emitting device, including a first terminal and a second terminal, the third light emitting device being connected between a second driving power line and the common connection pattern,
wherein at least one of the first and second light emitting devices is configured to connect to the second driving power line via the common connection pattern,
wherein the second terminal of the first light emitting device and the second light emitting device are connected to the common connection pattern, and
wherein the first terminal of the third light emitting device is connected to the common connection pattern.

8. The light emitting diode display apparatus according to claim 7, wherein the third light emitting device is disposed between the first gate line and the second gate line.

9. The light emitting diode display apparatus according to claim 8, wherein a portion of the common connection pattern is laser welded to the second driving power line to electrically connect the portion of the common connection pattern with the second driving power line.

10. The light emitting diode display apparatus according to claim 8, wherein:
the third light emitting device is disposed between the first light emitting device and the second light emitting device; and
the first light emitting device, the second light emitting device, and the third light emitting device are disposed along a direction parallel to the data line.

11. The light emitting diode display apparatus according to claim 8, wherein:
the third light emitting device is disposed between the first light emitting device and the second light emitting device; and
a distance between the third light emitting device and the first light emitting device is equal to a distance between the third light emitting device and the second light emitting device.

12. The light emitting diode display apparatus according to claim 8, wherein the common connection pattern includes:
a first terminal connection line connected with the second terminal of the first light emitting device;
a first overlap line extending from the first terminal connection line and overlapping with the second driving power line;

a second terminal connection line extending from the first overlap line, the second terminal connection line connecting to the first terminal of the third light emitting device;
a second overlap line extending from the second terminal connection line, the second overlap line connecting with the second driving power line; and
a third terminal connection line extending from the second overlap line, the third terminal connection line connecting to the second terminal of the second light emitting device.

13. The light emitting diode display apparatus according to claim 12, wherein at least one of the first overlap line and the second overlap line is laser welded to the second driving power line to electrically connect the at least one of the first overlap line and the second overlap line with the second driving power line.

14. The light emitting diode display apparatus according to claim 13, further comprising:
a passivation layer configured to cover the second driving power line; and
a planarization layer configured to cover the first to third light emitting devices, the planarization layer including a groove between the second driving power line and a portion of each of the first overlap line and the second overlap line,
wherein the portion of each of the first overlap line and the second overlap line is in the groove of the planarization layer, and
wherein the portion of each of the first overlap line and the second overlap line overlaps the second driving power line with the passivation layer interposed therebetween.

15. The light emitting diode display apparatus according to claim 8, wherein each of the first light emitting device, the second light emitting device, and the third light emitting device includes a micro light emitting diode chip.

16. The light emitting diode display apparatus according to claim 8, wherein:
the pixel further includes a reflection pattern on the substrate; and
at least a portion of each of the first, second, and third light emitting devices overlaps the reflection pattern.

17. The light emitting diode display apparatus according to claim 16, further comprising:
a passivation layer covering the second driving power line; and
a planarization layer covering the first to third light emitting devices, the planarization layer including a groove between the second driving power line and a portion of each of the first overlap line and the second overlap line,
wherein the portion of each of the first overlap line and the second overlap line is in the groove of the planarization layer, and
wherein the portion of each of the first overlap line and the second overlap line overlaps the second driving power line, with the passivation layer and the reflection pattern both interposed therebetween.

18. A display apparatus, comprising:
a pixel including:
a first light-emitting device including:
a first terminal; and
a second terminal;
a second light-emitting device including:
a first terminal; and
a second terminal;

a third light-emitting device including:
  a first terminal; and
  a second terminal;
a first pixel circuit connected to a first power line and configured to drive the first light-emitting device;
a second pixel circuit connected to the first power line and configured to drive the second light-emitting device; and
a connection pattern configured to connect the first light-emitting device and the second light-emitting device to the third light-emitting device,
wherein the third light-emitting device is connected between the connection pattern and a second power line that is parallel to the first power line,
wherein a portion of the connection pattern overlaps the second power line,
wherein the second terminal of the first light emitting device and the second light emitting device are connected to the connection pattern, and
wherein the first terminal of the third light emitting device is connected to the connection pattern.

19. The display apparatus of claim 18, wherein:
the third light-emitting device is series connected to the first light-emitting device through the connection pattern;
the third light-emitting device is series connected to the second light-emitting device through the connection pattern; and
the first light-emitting device and the second light-emitting device are parallel-connected to each other via the connection pattern.

20. The display apparatus of claim 18, wherein the portion of the connection pattern is welded to the second power line.

* * * * *